(12) United States Patent
Sato

(10) Patent No.: US 6,413,874 B1
(45) Date of Patent: Jul. 2, 2002

(54) METHOD AND APPARATUS FOR ETCHING A SEMICONDUCTOR ARTICLE AND METHOD OF PREPARING A SEMICONDUCTOR ARTICLE BY USING THE SAME

(75) Inventor: Nobuhiko Sato, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/217,130

(22) Filed: Dec. 21, 1998

(30) Foreign Application Priority Data

Dec. 26, 1997 (JP) .............................. 9-361572

(51) Int. Cl.⁷ ...................... H01L 21/302; H01L 21/461
(52) U.S. Cl. ........................ 438/714; 438/458; 438/719; 438/729
(58) Field of Search ................. 438/455, 458, 438/459, 13, 705, 706, 714, 715, 719, 723, 729

(56) References Cited

U.S. PATENT DOCUMENTS

| | | | | |
|---|---|---|---|---|
| 5,238,875 A | * | 8/1993 | Ogino | 438/459 |
| 5,310,689 A | | 5/1994 | Tomozane et al. | 438/766 |
| 5,371,037 A | | 12/1994 | Yonehara | 438/459 |
| 5,374,564 A | | 12/1994 | Bruel | 438/455 |
| 5,427,055 A | | 6/1995 | Ichikawa | 117/92 |
| 5,484,484 A | | 1/1996 | Yamaga et al. | 118/719 |
| 5,686,364 A | * | 11/1997 | Ohki et al. | 438/406 |
| 5,766,785 A | * | 6/1998 | Mikata et al. | 438/723 |
| 5,863,830 A | | 1/1999 | Bruel et al. | 438/478 |
| 5,869,387 A | | 2/1999 | Sato et al. | 438/459 |
| 5,994,207 A | | 11/1999 | Henley et al. | 438/515 |
| 6,171,982 B1 | | 1/2001 | Sato | 438/795 |

FOREIGN PATENT DOCUMENTS

| | | |
|---|---|---|
| EP | 0 463 870 | 1/1992 |
| JP | 2-98129 | 4/1990 |
| JP | 5-211128 | 8/1993 |
| JP | 5-217821 | 8/1993 |
| JP | 5-218053 | 8/1993 |

OTHER PUBLICATIONS

K. Izumi et al., "C.M.O.S. Devices Fabricated on Buried SiO₂ Layers Formed by Oxygen Implantation into Silicon", Electronics Letters, vol. 14, No. 18, pp. 593–594 (1978).
S. Nakashima et al., "Surface Morphology of Oxygen–Implanted Wafers", J. Mater. Res., vol. 5, No. 9, pp. 1918–1928 (1990).
L. Y. Yin et al., "Micromachined Integrated Optics for Free–Space Interconnections", IEEE Micro Electro Mechanical Systems, pp. 77–82 (1995).
T. Yonehara et al., "Epitaxial layer transfer by bond and etch back of porous Si", Appl. Phys. Lett., vol. 64, No. 16, pp. 2108–2110 (1994).
Y. Hayashi et al., "Record Low–Threshold Index–Guided InGaAs/GaAIAs Vertical–Cavity Surface–Emitting Laser with a Native Oxide Confinement Structure", Electronics Letters, vol. 31, No. 7, pp. 560–562 (1995).
B. Gallois et al., "Chemical Etching of Silicon (100) by Hydrogen", J. Am. Ceram. Soc., vol. 77, No. 11, pp. 2949–2952 (1994).
L. Zhong et al., "Outdiffusion of Impurity Atoms from Silicon Crystals and its Dependence upon the Annealing Atmosphere", Appl. Phys. Lett., vol. 68, No. 9, pp. 1229–1231 (1996).
N. Sato et al., "Hydrogen Annealed Silicon–on–Insulator", Appl. Phys. Lett.., vol. 65, No. 15, pp. 1924–1926 (1994).

* cited by examiner

Primary Examiner—Carl Whitehead, Jr.
Assistant Examiner—Jamie L. Brophy
(74) Attorney, Agent, or Firm—Fitzpatrick, Cella, Harper and Scinto

(57) ABSTRACT

With a method according to the invention, a semiconductor article such as an SOI substrate having on the surface thereof a single crystal silicon film formed on an insulator is etched by heat treatment in a hydrogen-containing reducing atmosphere in order to remove the surface by a desired height and smooth it. The method is characterized in that the single crystal silicon film is arranged opposite to silicon oxide in a furnace during the etching process.

82 Claims, 10 Drawing Sheets

(S21)

(S22)

(S23)

(S24)

(S31)

(S32)

(S33)

(S34)

(S35)

(S36)

FIG. 14
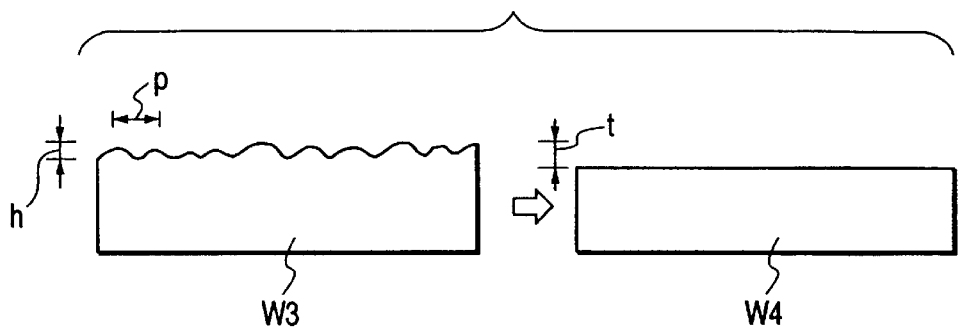
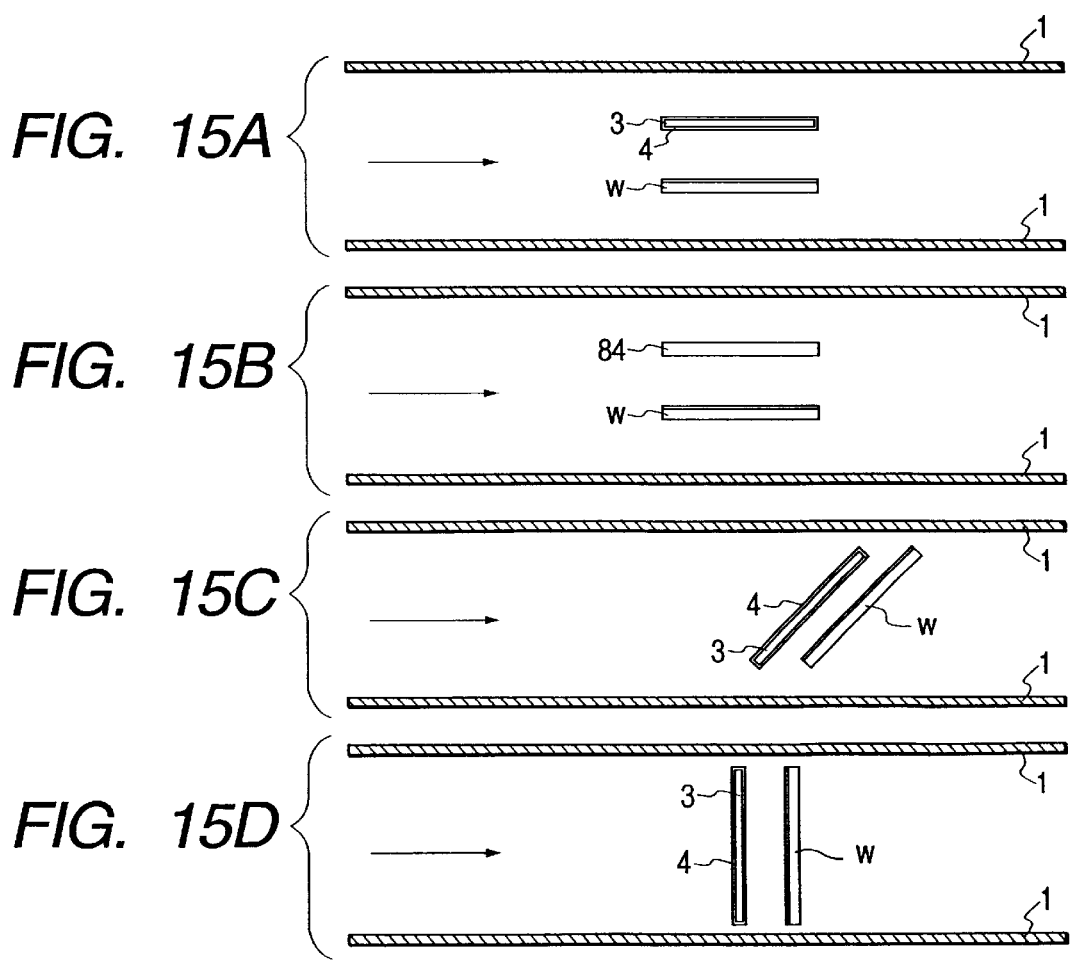
FIG. 15A
FIG. 15B
FIG. 15C
FIG. 15D

METHOD AND APPARATUS FOR ETCHING A SEMICONDUCTOR ARTICLE AND METHOD OF PREPARING A SEMICONDUCTOR ARTICLE BY USING THE SAME

BACKGROUND OF THE INVENTION

1. Field of the Invention

This invention relates to a method and an apparatus for etching a semiconductor article and also to a method of preparing a semiconductor article by using the same. More particularly, the present invention relates to a method and an apparatus for etching a semiconductor article having a silicon film and also to a method of preparing a semiconductor article by using the same.

2. Related Background Art

In the technological field of silicon type semiconductor devices and integrated circuits, a large number of researches have been made to date on devices having a semiconductor on insulator (SOI) structure produced by utilizing a single crystal semiconductor film formed on a film insulator because such devices provide a reduced parasitic capacitance, an improved resistance against radiation and an easy device isolation, which can lead to a high speed/low voltage operation of transistors, a low power consumption, an enhanced degree of adaptability to integration and a significant reduction in the number of manufacturing steps including elimination of the well-producing steps.

Known substrates having an SOI structure (SOI substrates) include SOS (silicon on sapphire) substrates, those prepared by oxidizing the surface of an Si single crystal substrate, forming a window to expose part of the Si substrate and realizing a lateral epitaxial growth by using that area as seed to form a Si single crystal film (layer) on the $SiO_2$ surface, those prepared by using a Si single crystal substrate itself as active layer and forming a silicon oxide film thereunder, those prepared by using a substrate having a dielectrically isolated Si single crystal region on a thick poly-crystalline Si layer and surrounded by a V-shaped groove and SOI substrates prepared by means of dielectric isolation involving oxidation of porous Si, which is referred to as FIPOS (full isolation by porous silicon).

Recently, the SIMOX (separation by implanted oxygen) technology and the wafer bonding technology seem to be in the main stream of the technological field of producing SOI structures. The SIMOX technology was reported for the first time in 1978 (K. Izumi, M. Doken and H. Ariyoshi, Electron. Lett. 14 (1978) p. 593). It provides a method of forming a buried silicon oxide film by implanting oxygen ions into a silicon substrate and subsequently heat-treating it at high temperature.

The wafer bonding technology provides, on the other hand, a variety of techniques for thinning one of the bonded wafers in the process of producing an SOI structure.
(BPSOI)

This is one of the most basic processes that utilizes polishing. A silicon oxide film is formed on the surface of one or both of a pair of wafers, which are bonded together. Subsequently, one of the wafers is thinned by grinding and polishing.
(PACE)

The plasma assisted chemical etching (PACE) process was developed to improve the uniformity of film thickness of the single crystal layer of SOI structure (referred to as SOI layer) obtained by polishing. With this technique, the film thickness is measured at thousands of highly densely distributed measuring points on the wafer. Then, a plasma source having a diameter of several millimeters is driven to scan the film at a scanning rate corresponding to the film thickness to vary the etching rate as a function of the film thickness distribution and thereby reduce the variations in the film thickness.
(Cleave Process using Hydrogen Ion Implantation)

A novel technique for producing a bonded SOI substrate was recently reported by M. Brue in Electronics Letters, 31 (1995) p.1201 and also disclosed in Japanese Patent Application Laid-Open No. 5-211128 and U.S. Pat. No. 5,374,564. With this process, an oxidized wafer that has been implanted with ions of a light element such as hydrogen or an inert gas element over the entire surface thereof is bonded to another wafer and subsequently heat-treated. Then, the wafer is cleaved during the heat treatment at the depth to which ions have been implanted. As a result, the layer located above the projection range of implanted ions is transferred onto the other wafer to produce an SOI structure.
(Epitaxial Layer Transfer)

Japanese Patent No. 2,608,351 and U.S. Pat. No. 5,371,037 describe an excellent technique for preparing an SOI substrate by transferring a single crystal layer on a porous layer onto another substrate. This technique is also referred to as "ELTRAN (registered tradename)"(T. Yonehara, K. Sakakguchi, N. Sato, Appl. Phys. Lett. 64 (1994), p.2108).

As discussed above, in the field of SOI substrates, smoothing the rough surface produced as a result of etching, ion implantation and subsequent heat treatment and, apart from this, forming an SOI layer of single crystal silicon with a low boron concentration by removing boron diffused into the SOI layer are the major problems that have to be solved somehow to improve the breakdown voltage of the gate oxide film, the control of threshold voltage in MOSFET and the carrier mobility of MOSFET in order to improve the performance of silicon type semiconductor devices. Thus, various techniques have been proposed to solve these problems for each of the above listed methods for preparing SOI substrates.

With the cleave process using hydrogen ion implantation, the surface of the wafer separated along the projection range shows a root-mean-square of surface roughness (Rrms) of 10 nm and the surface layer has damages caused by ion implantation. Such a wafer is smoothed to remove the layer damaged by ion implantation by polishing and removing the surface layer to a small extent, using a technique referred to as touch polishing (M. Bruel, et al., Proc. 1995 IEEE Int. SOI Conf. (1995) p.178).

In the case of the PACE technique, surface roughnesses up to 10.66 nm (as peak-to-valley value) are detected by means of an atomic force microscope immediately after the plasma etching process. Such rough surfaces can be then smoothed to 0.62 nm, or the level equivalent to the original surface roughness, by tough polishing the surface only to a slight extent (T. Feng, M. Matloubian, G. J. Gardopee, and D. P. Mathur, Proc. 1994 IEEE Int. SOI Conf. (1994) p.77).

When the BESOI technique is used, the surface roughness of about 5 to 7 nm (as peak-to-valley value) produced at the end of the etching process is removed only by removing the surface layer by three to five times of the surface roughness or by 20 to 30 nm. As a result of this polishing process, the uniformity of film thickness is degraded by 0.005 μm (=5 nm) in average.

Thus, when touch polish, or kiss polish as it is often called, is used to polish the surface only to a slight extent, the surface roughness may be removed but, at the same time, the film thickness will be reduced to consequently degrade the uniformity of film thickness. While the polishing operation is terminated generally by controlling the duration of the operation, it is a known fact that, if the polishing time is constant, the extent of polishing varies within the same surface of a wafer, among the surfaces of different wafers and from batch to batch depending on the polishing solution, the temperature of the surface table during the polishing operation and how much the emery cloth is worn and hence it is very difficult to keep the extent of polishing to a constant level. Particularly, it is known that the wafer is normally polished more along the outer periphery.

Additionally, it is impossible to reduce the boron concentration if boron is diffused across the entire depth of the SOI layer to show a high concentration level.

The surface roughness of the SOI layer of a wafer prepared by the SIMOX technique using oxygen ion implantation is greater than that of the bulk normally by a digit. S. Nakashima and K. Izumi (J. Mater. Res. (1990) Vol. 5, No. 9, p.1918) reported that the surface roughness with innumerable dents having a diameter of tens of several nanometers can be eliminated by heat-treating the surface at 1,260° C. (in a nitrogen atmosphere) for 2 hours or at 1,300° C. (in an argon atmosphere containing oxygen by 0.5%) for 4 hours. They also reported that the surface roughness will not change by a heat treatment at 1,150° C. However, it is practically impossible to use a quartz tube for a heat treatment conducted at temperature higher than 1,200° C. in terms of thermal resistance. Additionally, a process using such high temperature inevitably introduces serious slip lines as the wafer size increases.

With the oxygen implantation technique, there may arise a problem that boron contained in the clean room adhere to the surface of the substrate and implanted into the wafer in the operation of implanting oxygen ions (Co-implantation) and the boron atoms that have adhered to the wafer before the high temperature heat treatment process for turning the oxygen contained in the wafer by ion implantation into a silicon oxide layer can be diffused into the entire silicon layer by the heat treatment. A similar problem may be produced in a bonded SOI substrate by boron atoms contained in the clean room.

The inventors of the present invention proposed in Japanese Patent Application Laid-Open Nos. 5-218053 and 5-217821 a technique for smoothing the surface of an SOI substrate by heat-treating it in a hydrogen-containing atmosphere.

The surface of an SOI substrate that may carry undulations after the etching process and hence is rougher than the polished surface of a commercially available silicon wafer can be smoothed by hydrogen annealing to a level of smoothness comparable to the polished surface of such a commercially available silicon wafer. At the same time, the boron concentration of the single crystal silicon film can be reduced by annealing the substrate having a single crystal silicon film formed on an insulator in a hydrogen atmosphere and externally diffusing boron into the gas phase. While the rate of diffusion of boron is relatively high in silicon, it is low in a naturally oxidized silicon oxide layer that is typically formed on the surface of the substrate during a heat treatment process conducted in an oxygen or inert gas atmosphere so that boron will remain and be confined within the silicon layer. However, the silicon oxide film formed on the surface of the SOI layer and operating as diffusion barrier can be removed and any possible subsequent formation of oxide film during the process can be effectively suppressed by annealing the substrate in a reducing atmosphere typically containing hydrogen so that, as a result, the external diffusion of boron is enhanced and, if boron is contained in the entire SOI layer to a high concentration level, the impurity concentration of the entire SOI layer can be reduced to a level that is feasible for device fabrication by that external diffusion of boron (N. Sato and T. Yonehara, Appl. Phys. Lett. 65 (1994) p.1924).

Thus, a heat treatment in a hydrogen-containing atmosphere is a highly effective way for externally diffusing boron contained in the silicon layer and smoothing the surface thereof showing a remarkable degree of roughness.

A heat treatment in a hydrogen-containing atmosphere is also highly effective for preparing an SOI substrate by means of the SIMOX technique. The above paper also reports that the surface roughness can be smoothed satisfactorily by heat treatment conducted at or below 1,200° C. in a hydrogen-containing atmosphere.

When annealing an SOI substrate by means of hydrogen, the rate of reduction of the film thickness will be about 0.08 nm/min. at 1,150° C., which is much lower than the rate of reduction in case of polishing. However, when annealing a bulk wafer in place of an SOI substrate by means of hydrogen, a relatively high rate of reduction of 10 to 100 nm/min. in the film thickness is reported in B. M. Gallois et al., J. Am. Ceram. Soc., 77 (1994) p.2949. It will be appreciated that the uniformity of film thickness is apt to be degraded in a same wafer surface and among the surfaces of different wafers when the rate of film thickness reduction and the etching rate are not controlled properly.

Thus, it is highly important to precisely control the film thickness for each wafer and among different wafers because noticeable variations in the film thickness of the SOI layer can significantly affect the performance of the devices produced as final products, particularly in terms of the characteristics including the threshold voltage of SOI-MOS transistors of fully depleted type.

There are also requirements to be met by an SOI substrate other than the uniformity of film thickness.

The film thickness of the SOI layer varies depending on the characteristics of the semiconductor device to be produced by using the SOI substrate. While this problem may be addressed by thermally oxidizing the surface of the prepared SOI layer and subsequently removing the oxide film produced as a result of thermal oxidation by means of wet etching, using hydrofluoric acid (sacrificial oxidation), such a technique involves complicated manufacturing steps and hence is practically not feasible.

Additionally, the top layer of the prepared SOI layer are apt to show a relatively large number of flaws as pointed out above by referring to the cleave process by hydrogen ion implantation and hence it is important to reduce the number of such flaws.

SUMMARY OF THE INVENTION

Thus, it is an object of the present invention to provide a method and an apparatus for etching a semiconductor article adapted to controlling with ease the etching rate and the uniformity of film thickness among different substrates as well as a method of preparing a semiconductor article by using such a method and such an apparatus.

Another object of the present invention is to provide a method and an apparatus for etching a semiconductor article adapted to efficiently reducing the impurities such as boron contained in the film, while maintaining the uniformity of film thickness, as well as a method of preparing a semiconductor article by using such a method and such an apparatus.

Still another object of the present invention is to provide a method and an apparatus for etching a semiconductor article adapted to reducing the variations in the performance among the devices produced by using the semiconductor article as well as to a method of preparing a semiconductor article by using such a method and such an apparatus.

A further object of the present invention is to provide a method and an apparatus for etching a semiconductor article at low cost adapted to obtaining a desired film thickness and a surface condition substantially free from surface defects as well as to a method of preparing a semiconductor article by using such a method and such an apparatus.

According to the invention, the above objects and other objects of the invention are achieved by providing a method for etching a semiconductor article having a surface comprising silicon, said method comprising a step of heat-treating the silicon surface in a hydrogen-containing reducing atmosphere, with keeping the silicon surface in a state disposed opposite to a surface comprising silicon oxide with a predetermined distance separating them.

According to the invention, there is provided a method of preparing a semiconductor article, comprising a step of etching a surface comprising silicon, the surface being obtained by bonding a pair of articles and removing unnecessary portions of one of the articles, by means of the above defined etching method.

BRIEF DESCRIPTION OF THE DRAWINGS

FIG. 14 is a schematic illustration of an etching method according to the invention.

FIGS. 15A, 15B, 15C and 15D are schematic illustrations showing how articles are arranged for an etching operation for the purpose of the invention.

DESCRIPTION OF THE PREFERRED EMBODIMENTS

Figure 1:
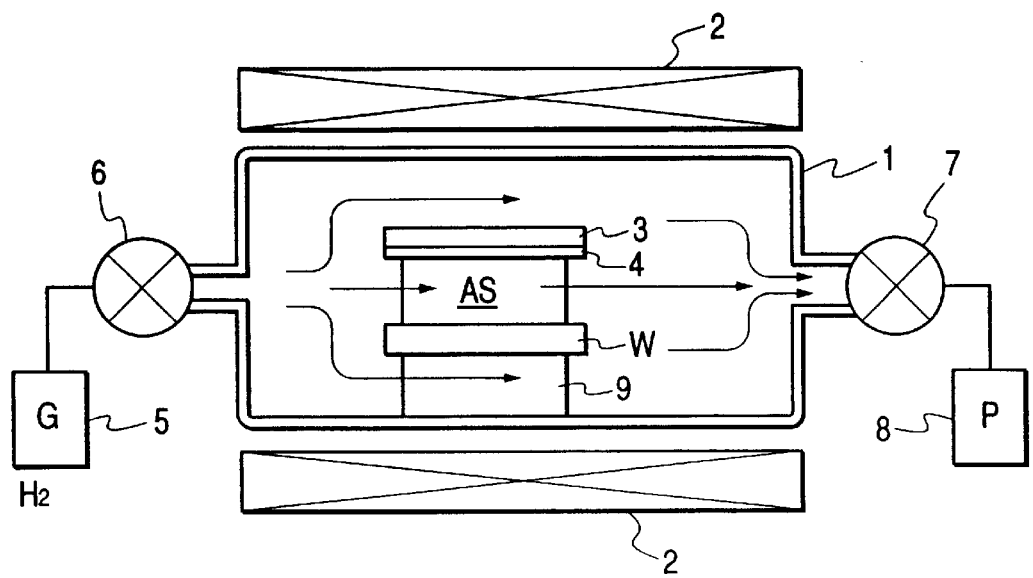
FIG. 1 is a schematic cross sectional view of an embodiment of etching apparatus according to the invention.

FIG. 1 is a schematic cross sectional view of an embodiment of etching apparatus according to the invention.

This etching apparatus comprises a reaction furnace 1 operating as etching chamber and adapted to contain a semiconductor article W and get evacuated and a heater 2 for heating the article W and the gas contained in the furnace 1. It is connected to a hydrogen gas source 5 by way of at least a valve 6 and also to an exhaust pump 8 by way of at least a valve 7.

A counter-surface constituting member 3 that carries silicon oxide 4 on the surface is arranged at the side of the surface of the article W to be treated with a predetermined gap AS interposed therebetween. In FIG. 1, numeral 9 denotes a support member for supporting both the article W and the counter-surface constituting member 3.

The etching operation using this embodiment proceeds in a manner as described below.

Firstly, an article W and an counter-surface constituting member 3 are placed in the reaction furnace 1 with a predetermined gap AS interposed therebetween. Then, they are heated by the heater 2. Optionally, the inside of the furnace is evacuated by the exhaust pump 8 to reduce the internal pressure.

Thereafter, hydrogen gas is introduced into the furnace from the gas source 5. The inside of the furnace and the article W are held to a predetermined temperature level by controlling the heat generation of the heater 2.

Then, as a result, silicon is etched from the surface (to be treated) of the article W.

The article W to be etched by a method according to the invention may be a bulk Si wafer prepared by means of a CZ process, an epitaxial Si wafer having an epitaxially grown layer, an Si wafer obtained by treating a bulk Si wafer by means of a hydrogen annealing process, an SOI wafer of any of the above described types or a substrate having a silicon film. In particular, it is preferably a wafer that has been subjected to a surface treatment process after polished and is carrying undulations on the surface, a wafer having an unpolished surface or an SOI wafer on the way of preparation using a bonding process or a SIMOX process.

Since an article W is heat-treated in an hydrogen-containing atmosphere according to the invention, the source gas to be fed into the furnace refers to 100% hydrogen gas, inert gas such as rare gas containing hydrogen by 1 to 99%. Preferably, relatively highly pure hydrogen gas that is sufficiently free from moisture is fed into the furnace by way of a hydrogen refining system (hydrogen purifier) so that the reducing atmosphere may show a dew point not higher than −92° C.

The oxygen and moisture content of the atmosphere should be held to a minimal level because any oxygen and moisture remaining in the atmosphere can oxidize silicon on the surface of the article W to produce a film coat as the temperature is raised and the produced film coat by turn obstructs the process of smoothing the surface and also because the residual oxygen and moisture can give rise to an unexpected reduction in the silicon film thickness as a side effect of oxidation and etching. This is why it is desirably to control the atmosphere so as to make it show a dew point not higher than −92° C.

While the hydrogen-containing atmosphere may show a pressure level higher than, equal to or lower than the atmospheric pressure, its pressure is preferably lower than the atmospheric pressure, since a lower pressure level may be advantageous to improve the surface smoothing effect and the effect of externally diffusing the impurities. When an etching furnace is made of vitreous silica such as fused quartz and synthetic fused silica, the lower limit of the pressure of the atmosphere in the furnace is preferably set to $3.9 \times 10^4$ Pa, more preferably to $6.6 \times 10^4$ Pa in order to prevent the furnace from being deformed.

In view of the above considerations, it is reasonable to select a pressure level between the atmospheric pressure and 1.3 Pa for the pressure of the atmosphere in the furnace, taking the operation environment into consideration.

Although there is no limit for the flow rate of hydrogen-containing gas to be used for the purpose of the invention, the flow rate as discussed below is preferably used.

The flow rate as used herein refers to the flow rate of gas passing through an area obtained by subtracting the cross sectional area of the semiconductor article from the cross sectional area of the furnace tube.

If the gas flow rate is too high, the rate of removing the reaction product from the surface of the article is raised to reduce the etching suppressing effect.

If, on the other hand, the gas flow rate is too low, the rate of removing the reaction product from the surface of the articles is remarkably reduced to reduce the effect of removing the impurities such as boron by externally diffusing them from the semiconductor single crystal layer.

For the purpose of the invention, the gas flow rate is preferably 10 to 300 cc/min.cm$^2$, more preferably 30 to 150 cc/min.cm$^2$. The gas flow rate is a parameter for controlling the rate of diffusing and removing the reaction product from the surface to the lateral sides of the article.

The surface of the article is satisfactorily etched and smoothed in a hydrogen-containing atmosphere at temperature below 1,200° C., at which the surface may not be smoothed in a nitrogen atmosphere or a rare gas atmosphere. For the purpose of the invention, the temperature to be used for the etching process that has a smoothing effect depends on the composition and the pressure of gas. More specifically, the temperature is found within a range whose lower limit is preferably not lower than 300° C., more preferably not lower than 500° C., further preferably not lower than 800° C. On the other hand, the upper limit of the temperature range is preferably not higher than the melting point of silicon, more preferably not higher than 1,200° C. If the smoothing process proceeds too slowly, a smoothed surface can be obtained by using a longer period of time for the heat treatment. Regardless of the material constituting the counter-surface, the etching efficiency can be improved by reducing the pressure of the atmosphere if the distance separating the oppositely disposed surfaces is invariable because of an intensified interaction of the oppositely disposed surfaces. This is attributable to an increased diffusion length of gas molecules that appears when the pressure is reduced.

For the purpose of the invention, while the counter-surface constituting member 3 may be made of any material so long as the counter-surface carries silicon oxide thereon, it is preferably an Si wafer having a surface on which a silicon oxide film formed thereon or quartz wafer. A wafer having a structure same as the article to be etched may preferably be used for the counter-surface constituting member 3 if the counter-surface carries silicon oxide film thereon.

The counter-surface should be plane and held in parallel with the surface to be treated. As for size and shape, the counter-surface preferably has a size equal to or greater than that of the surface to be treated of the article W and a profile similar to that of the article W.

The counter-surface constituting member 3 may preferably be part of the support member 9, which may typically be a tray.

While the distance, or the gap AS, separating the counter-surface and the article may vary as a function of the silicon surface area (to be etched) of the semiconductor article, it is preferably not greater than 20 mm, more preferably not greater than 10 mm, to achieve an effect of boosting the etching due to the interaction of the oppositely disposed surfaces, when the semiconductor article has a diameter greater than 100 mm. Although the distance between the oppositely disposed surfaces has no particular lower limit, it is practically not smaller than 1 mm, preferably not smaller 3 mm.

A surface smoothing process starts when the cleansed surface of the semiconductor article W is heat-treated. Therefore, if the surface of the article is coated with a thick natural oxide film, it is preferably removed by etching, using dilute hydrofluoric acid in order to make the surface smoothing process start early.

The silicon surface smoothed in this way is highly suited for preparing semiconductor devices. If the counter-surface constituting member of silicon or SiC carries a silicon oxide film on its counter-surface arranged opposite to the article, the silicon oxide film gradually loses its film thickness in the etching process and the etching rate of the article dramatically drops to about ⅒ of the initial rate when the silicon oxide film is totally lost. Therefore, on the basis of this phenomenon, the silicon layer on the surface of the article can be etched in a well controlled manner with an enhanced level of reproducibility by making the silicon oxide film to have such a film thickness that the film contains a number of Si atoms equal to the number of Si atoms contained in the silicon layer that has to be removed by etching. If the silicon oxide film of the counter-surface is of the stoichiometric composition and produced by a thermal oxidation process, the silicon oxide film of the counter-surface constituting member preferably has a film thickness (tox) that is about 2.22 time greater than the thickness of the silicon layer to be removed. Thus, to allow a margin for the duration of heat treatment, the thickness (tox) should be at least 2.22 times greater than the thickness of the silicon layer to be removed.

According to the invention, the rate of etching a silicon film can be controlled without difficulty within a range between $1.0 \times 10_{-3}$ nm/min. and 1.0 nm/min. Taking the efficiency of heat treatment into consideration, the etching process is preferably conducted at temperature higher than 1,080° C. with an etching rate of not lower than 0.046 nm/min. or at temperature higher than 1,100° C. with an etching rate of not lower than 0.11 nm/min.

By such an etching process, the surface defects of the silicon film can be sufficiently eliminated when the film is etched by 10 nm to 200 nm from the surface. Particularly, in the case of an SOI substrate, an SOI layer having a thickness between 20 nm and 250 nm can be produced without difficulty by etching the silicon film that typically has a film thickness between 50 nm and 500 nm by using an etching method and an etching apparatus according to the invention.

Then, the obtained surface will show, for example, an Rrms value of at least not greater than 0.4 nm, preferably not greater than 0.2 nm, more preferably not greater than 0.15 nm, in a 1 μm square area.

Hydrogen containing gas may be introduced into the furnace in any appropriate manner as will be described hereinafter and the present invention is not limited to the arrangement of FIG. 1 in terms of the way of introducing gas into the furnace.

While the reaction furnace 1 may be made of SiC, it is preferably made of vitreous silica for the purpose of the invention.

For the purpose of the invention, the heater 2 may be a resistance heater, a radio frequency heater or an infrared lamp.

Now, some of the findings that have led to the present invention will be described below.
(Findings on the Dependency of the Etching Rate on the Material of the Counter-Surface)

The inventors of the present invention looked into the conditions for the heat treatment to be conducted in a hydrogen-containing atmosphere in order to remove fine undulations on a silicon single crystal surface and found that the rate of etching single crystal silicon varies remarkably depending on the material of the surface opposing the single crystal silicon surface (counter-surface).

Figure 2:
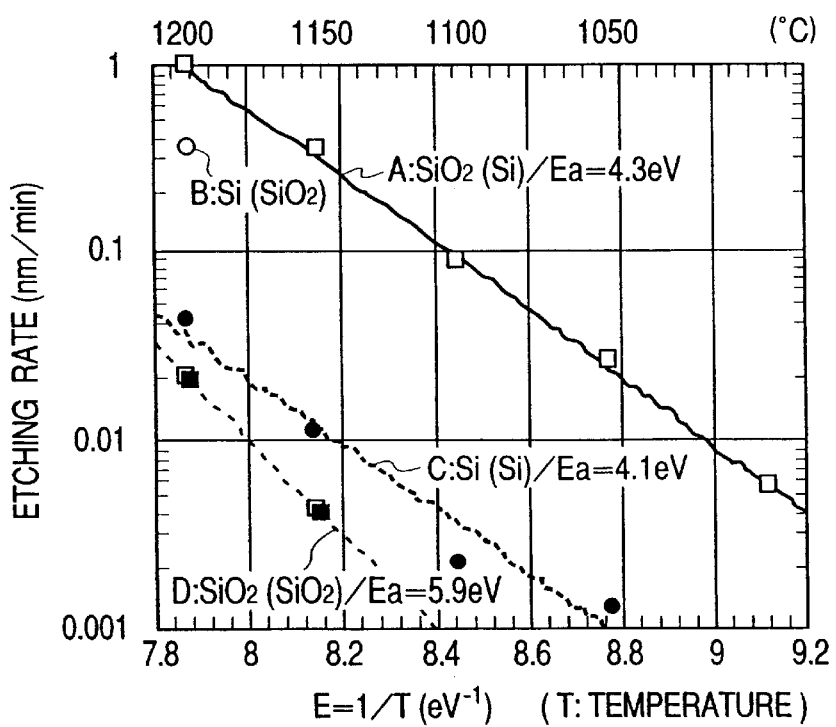
FIG. 2 is a graph showing the dependency of the etching rate on the material of the counter-surface.

FIG. 2 is a graph showing the dependency of the etching rate on the material of the counter-surface and the heat treatment temperature. In the graph of FIG. 2, the lower horizontal axis represents the reciprocal number of temperature (T) and the upper horizontal axis represents the temperature corresponding to 1/T, whereas the vertical axis represents the logarithmically expressed etching rate (nm/min.). The film thickness of the SOI layer or the single crystal silicon layer on a buried insulator can be observed without difficulty by means of a commercially available light-reflection type film thickness gauge. Then, the etching rate can be determined by observing the film thickness before and after the heat treatment with varied durations and calculating the change with time of the film thickness.

In FIG. 2, data set A represents the etching rate that varies as a function of temperature when an counter-surface of Si is arranged opposite to an article of $SiO_2$ that is etched. The activation energy Ea as obtained from the inclination of the approximate line produced by using the method of least squares of the observed values on the plot was about 4.3 eV.

Data set B in FIG. 2 represents the etching rate in a heat treatment process when a counter-surface of $SiO_2$ is arranged opposite to an article of Si that is etched.

Data set C in FIG. 2 represents the etching rate in another heat treatment process when a counter-surface of Si is arranged opposite to an article of Si that is etched. The activation energy Ea of this heat treatment was about 4.1 eV.

Finally, data set D in FIG. 2 represents the etching rate in another heat treatment process when a counter-surface of $SiO_2$ is arranged opposite to an article of $SiO_2$ that is etched. The activation energy Ea of this heat treatment was about 5.9 eV.

As seen from data sets B and C FIG. 2, with a heat treatment conducted in a hydrogen-containing atmosphere, the silicon etching rate is increased by 9 times without changing the temperature when the counter-surface of silicon is replaced by a counter-surface of silicon oxide.

More specifically, the etching rate is as low as about 0.045 nm/min at 1,200° C. when two single crystal silicon surfaces are arranged vis-a-vis, or a silicon counter-surface is arranged opposite to a silicon surface to be etched (C in FIG. 2). Only less than 3 nm of the film is etched out after 60 minutes in the heat treatment. To the contrary, the etching rate is raised to about 0.36 nm/min at 1,200° C. so that as much as 21.6 nm of the film is etched out after an hour when a silicon oxide counter-surface is arranged opposite to a silicon surface to be etched (B in FIG. 2). This etching thickness is comparable with that of a touch polish process.

Figure 3:
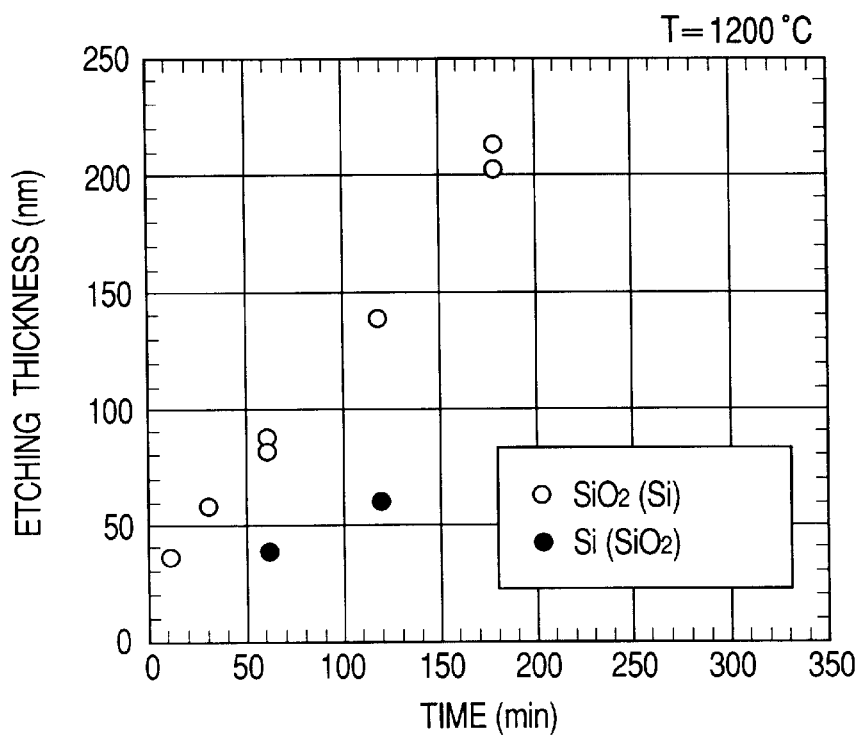
FIG. 3 is a graph showing the etching rate when the materials of the oppositely disposed surfaces are Si and $SiO_2$.

FIG. 3 is a graph showing the etching rate when the materials of the oppositely disposed surfaces are Si and $SiO_2$. In FIG. 3, the horizontal axis represents the etching time (min.) whereas the vertical axis represents the etching thickness (nm) and the heat treatment is conducted at temperature T of 1,200° C. In FIG. 3, the white circles show the values obtained when the article has an $SiO_2$ surface and the counter-surface is made of Si, whereas the black circles show the values observed when the article has an Si surface and the counter-surface is made of $SiO_2$.

As seen from FIG. 3, with a same duration of heat treatment, film is etched out to a greater extent when the article has an $SiO_2$ surface and the counter-surface is made of Si as indicated by white circles than when the article has an Si surface and the counter-surface is made of $SiO_2$ as indicated by black circles. In short, when an $SiO_2$ surface and an Si surface are oppositely arranged for heat treatment, the $SiO_2$ surface is etched to a greater extent than the Si surface.

Figure 4:
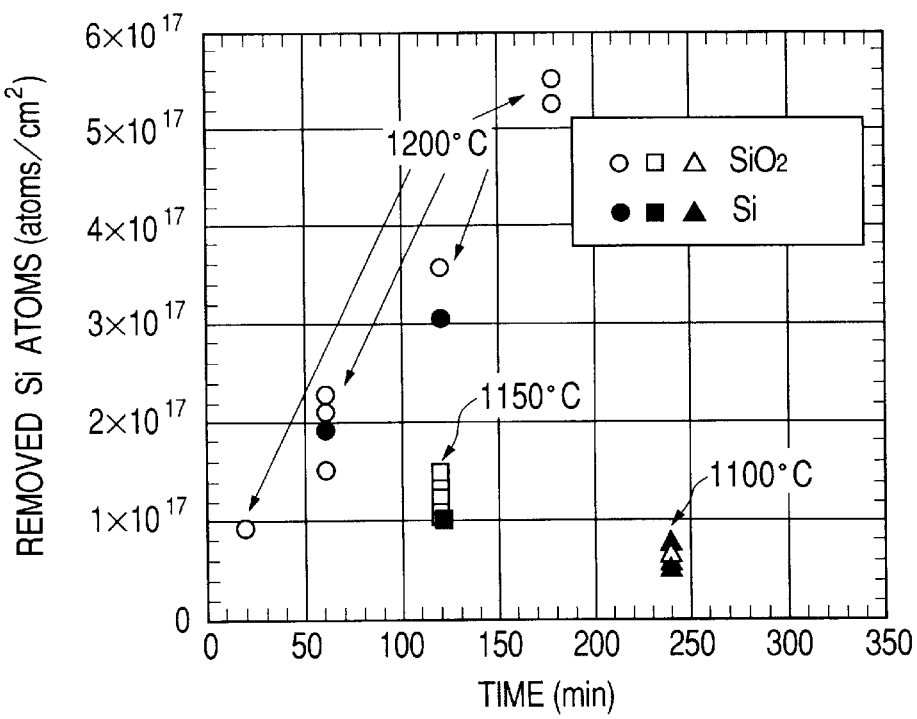
FIG. 4 is a graph showing the rate of removing Si atoms when the materials of the oppositely disposed surfaces are Si and $SiO_2$.

FIG. 4 is a graph showing the rate of removing Si atoms when an $SiO_2$ surface is etched, using an Si counter-surface, and that of removing Si atoms when an Si surface is etched, using an $SiO_2$ counter-surface is used, as obtained by calculation on the basis of FIG. 3. In FIG. 4, the horizontal axis represents the etching time and the vertical axis represents the number of removed Si atoms (atmos/cm$^2$), the observed $SiO_2$ surfaces being indicated by white circles, triangles and squares, the observed Si surfaces being indicated by black circles, triangles and squares.

It will be appreciated from FIG. 4, which shows the number of removed silicon atoms calculated from the etched volume of a silicon oxide surface and also the number of silicon atoms calculated from the etched volume of a single crystal silicon surface as illustrated in FIG. 3, that the number of removed silicon atoms is substantially same for the two surfaces, meaning that, when an Si surface and an $SiO_2$ surface are arranged oppositely relative to each other for heat treatment, Si atoms will be lost substantially at a same rate from the two surfaces.

Thus, the rate of etching a silicon surface is accelerated by the interaction with a silicon oxide surface arranged opposite to it. This interaction will totally be expressed by the reaction formula shown below, where silicon and silicon oxide react with a ratio of 1:1.

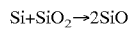
$$Si+SiO_2 \rightarrow 2SiO$$

The Si etching rate is affected by the distance between the Si surface and the counter-surface. It has been found that, when a silicon counter-surface is used, the etching rate is reduced as the distance separating the two surfaces is reduced. When, on the other hand, a silicon oxide counter-surface is used, the etching rate is raised as the distance between the two surfaces is reduced.

Additionally, the etching rate is remarkably low when the etching process is conducted in an atmosphere containing no reducing gas, which is typically hydrogen gas, if compared with the etching rate observed when the atmosphere contains hydrogen. In short, the presence of reducing gas, which is typically hydrogen gas, can significantly accelerate the etching rate. When a silicon surface and a silicon oxide surface are arranged opposite to each other in the etching system, the two surfaces are etched as the material of either one of the surfaces gets to the other one by way of the reaction with the reducing gas, which is typically hydrogen gas. For instance, there may be reactions expressed by $Si+H_2 \rightarrow SiH_2$ and $SiH_2+SiO_2 \rightarrow 2 \rightarrow SiO+H_2$. The Si atoms that have left the Si surface are, at least partly, transported through the gas phase to the silicon oxide surface, where they react with $SiO_2$ to produce SiO, which shows high saturated vapor pressure. Since $SiH_2$ is consumed continuously, the etching process on the Si surface will be promoted. When, on the other hand, two Si surfaces are arranged opposite to each other, the rate of chemical reaction is determined as a function of the diffusion of Si atoms in the vapor phase once they get to show a saturated concentration level, which is not very high, so that the etching rate will not become very high.

To the contrary, when an Si surface and an $SiO_2$ surface are opposed, the Si atoms that have left the Si surface are, at least partly, consumed on the surface of the oxide film so that the chemical reaction will further proceed without any restrictions. Since SiO that can be produced on the $SiO_2$ surface shows a high vapor pressure, the reaction can proceed without restrictions. When an SiC surface is arranged opposite to a single crystal silicon film, the rate of etching the single crystal silicon film is substantially same as the limited etching rate that is observed when silicon is used for the counter-surface. Likewise, when a silicon nitride surface is arranged opposite to a single crystal silicon film, the rate of etching the single crystal silicon film is also low and substantially same as the limited etching rate observed when silicon is used for the counter-surface.

In short, in the process of heat-treating silicon in a hydrogen-containing atmosphere, the etching rate will be about ten times greater when the counter-surface is made of silicon oxide than when the counter-surface is made of silicon.

(Etching Apparatus)

While FIG. 1 shows a typical etching apparatus according to the invention, it may be modified in various different ways as will be described hereinafter.

Figure 5:
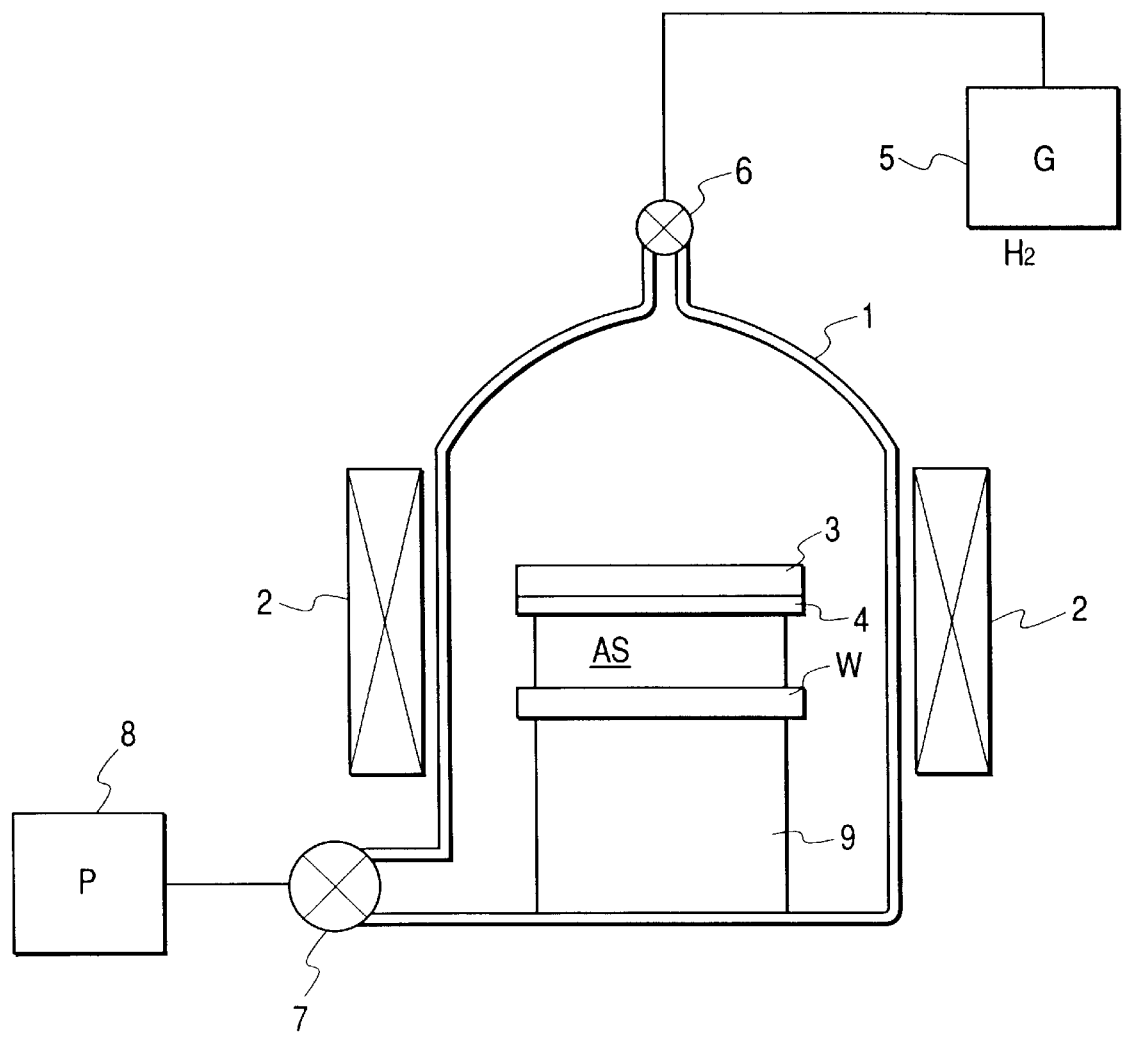
FIG. 5 is a schematic cross sectional view of another embodiment of etching apparatus according to the invention.

FIG. 5 is a schematic cross sectional view of another embodiment of etching apparatus according to the invention.

The embodiment of FIG. 5 is so configured that part of hydrogen-containing gas from the gas source 5 is made to pass the gap, or the acting space AS, between the article W and the counter-surface constituting member 3 before it flows into the exhaust pump 8. The mode of arrangement of the article W and the counter-surface constituting member 3 is not limited to the one as shown in FIG. 1, where the they are arranged longitudinally (transversally in the drawing) in parallel with the furnace tube of the furnace 1. They may alternatively be arranged as shown in FIG. 5 or still alternatively be arranged in an inclined fashion or vertically in a horizontal furnace.

Still alternatively, a plurality of articles W may be arranged at intervals and in parallel with each other in a single furnace.

Figure 6:
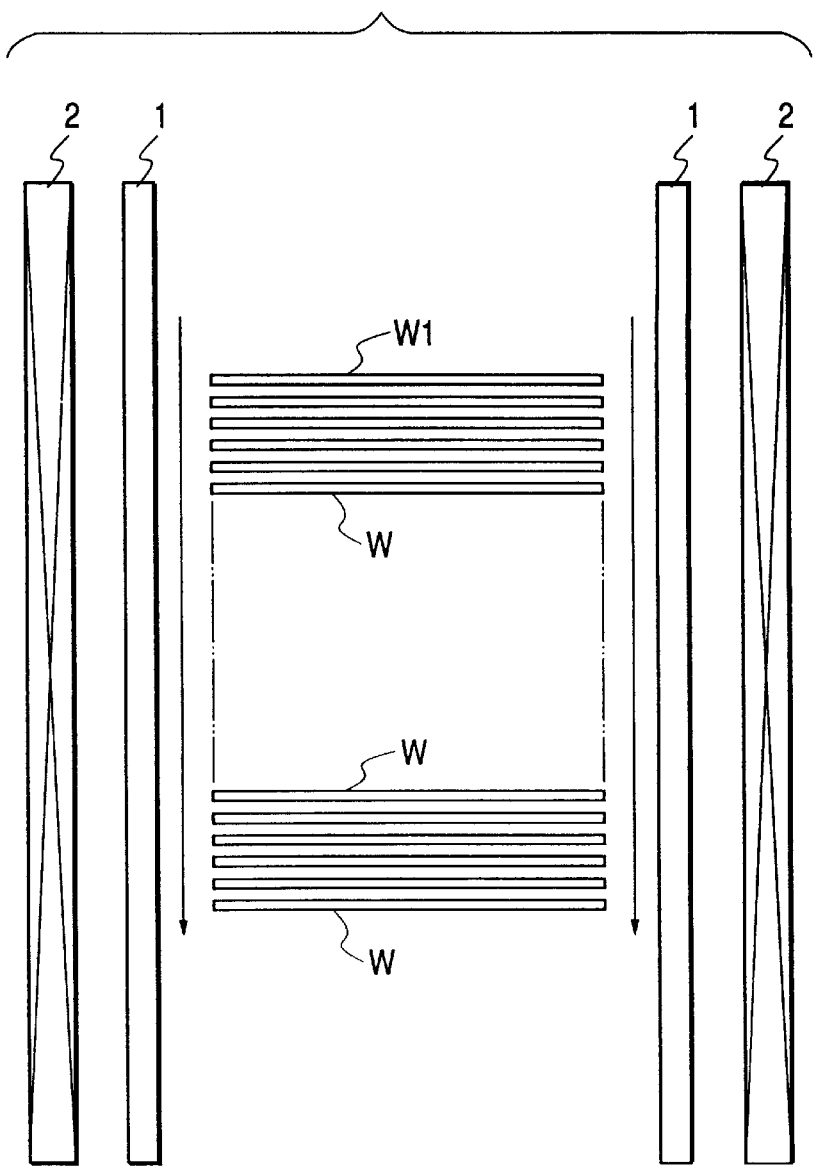
FIG. 6 is a schematic cross sectional view of a still another embodiment of etching apparatus according to the invention, showing a principal area thereof.

FIG. 6 is a schematic cross sectional view of an embodiment of etching apparatus according to the invention and adapted to collectively etch a plurality of articles.

With the embodiment of etching apparatus of FIG. 6, a plurality of articles, W1, W having a silicon oxide film on the rear surface are arranged in the furnace in such a way that all the front surfaces of the articles are directed upward. Then, since no counter-surface is found for the top article W1, the silicon surface of the article W1 will not be etched in an intended manner. Differently stated, the top article W1 operates as a dummy article. All the articles W except the top article W have a counter-surface located vis-a-vis, which is the silicon oxide rear surface of the directly upper articles W, so that all the silicon surfaces of the articles W will be etched properly.

When all the articles W1, W are arranged with the silicon front surfaces directed downward, the bottom article operates as a dummy article.

FIG. 6 shows only a principal area of a vertical furnace. When a horizontal furnace having a configuration that can be realized by substantially turning the furnace of FIG. 6 to a lateral side is used, a plurality of articles will be arranged side by side and collectively etched in a similar fashion.

Note, however, that the furnace of FIG. 6 is adapted only to collectively heat-treat and etch articles having a silicon oxide rear surface.

Figure 7:
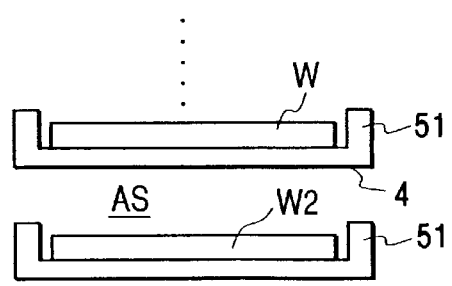
FIG. 7 is a schematic cross sectional view of a pair of counter-surface constituting members, showing a mode of arrangement that can be used for the purpose of the invention.

FIG. 7 shows an arrangement adapted to heat-treating articles having a non-oxidized silicon rear surface, which may be made of Si, SiC or SiN.

With this arrangement, a counter-surface constituting member 51 having at least a silicon oxide rear surface is interposed between two adjacent articles so that the Si surface of the lower article W2 is located vis-a-vis the silicon oxide rear surface (counter-surface 4) of the counter-surface constituting member 51. Thus, the Si surface of the article W2 will be etched properly. While the counter-surface constituting members 51 of FIG. 7 have a tray-like profile, they are not limited to such a shape and may be replaced by plate-shaped members.

In any case, the distance between the Si surface and the counter-surface is preferably not greater than 20 mm, more preferably not greater than 10 mm, to achieve an effect of boosting the etching due to the interaction of the oppositely disposed surfaces, when the semiconductor article has a diameter greater than 100 mm.

The rate of etching the silicon on the principal surface (front surface) of the article during the heat treatment process conducted in a hydrogen-containing atmosphere is accelerated when one or more than one oxidizing impurities such as moisture and/or oxygen are contained in the atmosphere gas. The etching effect due to these gaseous impurities can be reduced by reducing the flow rate of atmosphere gas on and near the principal surface in order to reduce the rate of supply of the impurities such as moisture and/or oxygen. In this manner, the etching process involving the interaction of the silicon surface and the silicon oxide counter-surface can be rigorously controlled. Particularly, as shown in FIG. 8, the flow rate 12 of atmosphere gas on the front surface of article W can be reduced practically to 0 and the etching potential of the silicon oxide of the counter-surface can be maximally exploited when the article W is so arranged in the furnace tube 1 that the gas flows 11 and 14 intersect the direction of the silicon surface of the article and the silicon oxide counter-surface 4 of the counter-surface constituting member 3 is located vis-a-vis the silicon surface and separated from the latter by not greater than 20 mm as shown in FIG. 8.

Figure 8:
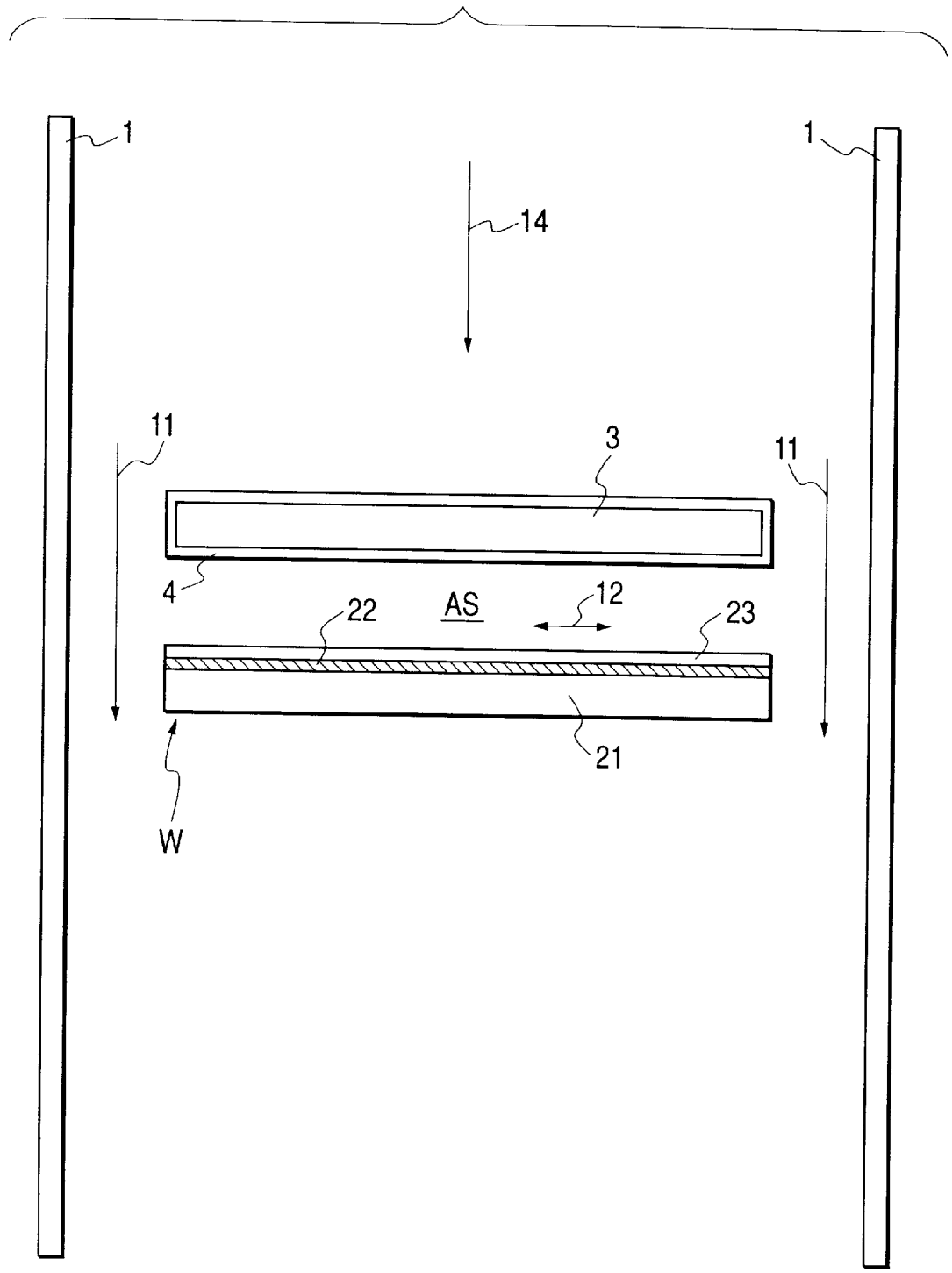
FIG. 8 is a schematic cross sectional view of a semiconductor article and a counter-surface constituting member, showing another mode of arrangement that can be used for the purpose of the invention.

Note that, in FIG. 8, there are shown an SOI substrate comprising a buried insulation film 22 and an SOI layer 23 formed on a silicon substrate 21 and a counter-surface constituting member 3 comprising a silicon substrate and a silicon oxide film formed on the surface thereof.

Figure 9:
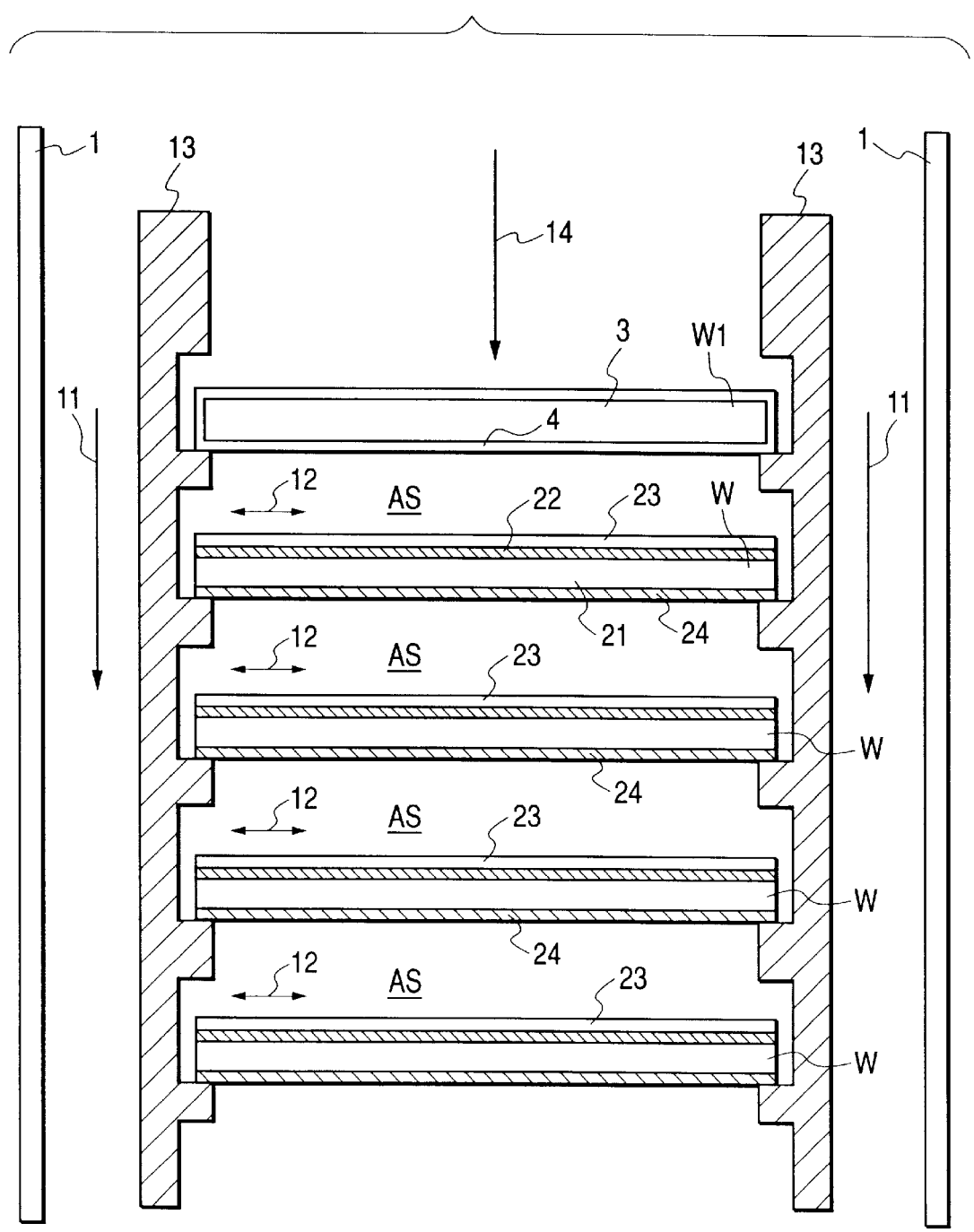
FIG. 9 is a schematic cross sectional view of a still another embodiment of etching apparatus according to the invention, showing a principal area thereof.

FIG. 9 is a schematic cross sectional view of an etching apparatus prepared by modifying the vertical furnace shown in FIG. 5.

In FIG. 9, a total of four articles W and a dummy article W1 are arranged coaxially and held by respective projections of boat 13, which is the support member of the etching apparatus.

The dummy article W1 is an Si substrate carrying a silicon oxide film on both the front and rear surfaces, whereas the articles W are Si substrates carrying a silicon oxide film only on the rear surface.

In this case again, the flow rate 11 of gas passing through the area obtained by subtracting the cross sectional area of the semiconductor articles from the cross sectional area of the furnace tube (outer peripheral area of the furnace tube) is controlled to 10 cc/min.cm$^2$ to 300 cc/min.cm$^2$ and the flow rate 12 of gas on and near the front surface of each article W that is running in parallel with the front surface is made lower than the flow rate 11 of gas running perpendicularly to the front surface in the outer peripheral area of the article W.

Preferably, the flow rate 11 of gas passing through the area obtained by subtracting the cross sectional area of the semiconductor articles from the cross sectional area of the furnace tube (outer peripheral area of the furnace tube) is controlled to 30 cc/min.cm$^2$ to 150 cc/min.cm$^2$ and the flow rate 12 of gas on and near the front surface of each article W that is running in parallel with the front surface is made practically equal to 0.

With any of the above described embodiments of etching apparatus, the furnace 1, the tray 31, the support members 9, 13 are preferably made of vitreous silica.

The heater 2 may be a resistance heater, a high frequency heater or a lamp heater.

(Method of Preparing a Semiconductor Article)

Now, a method of preparing a semiconductor article, using an etching method according to the invention, will be described.

Figure 10:
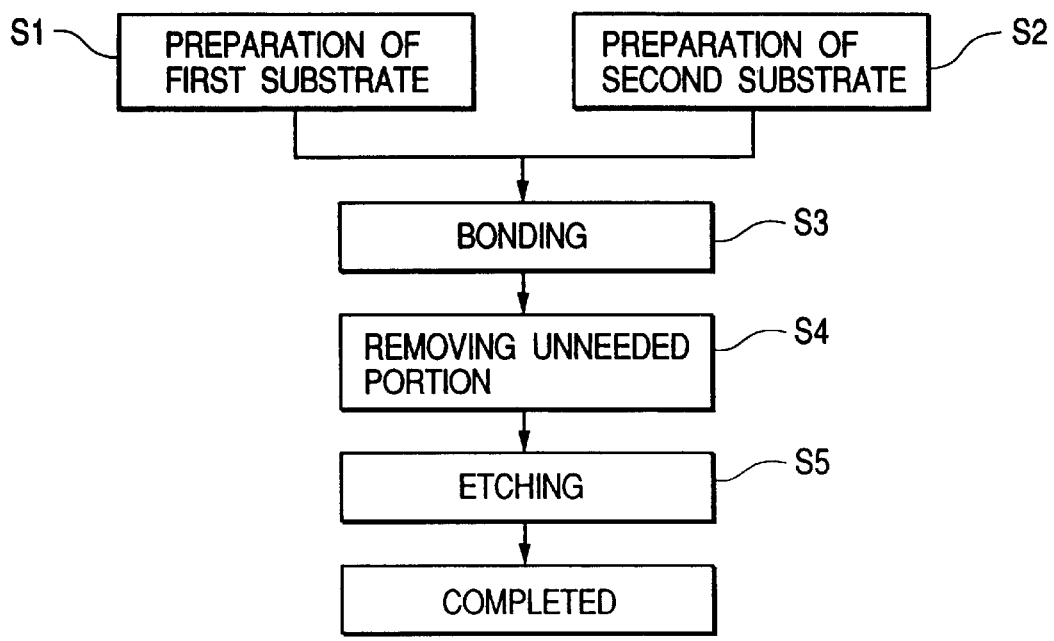
FIG. 10 is a flow chart for a mode of carrying out a method of preparing a semiconductor article by using an etching method according to the invention.

FIG. 10 is a flow chart for preparing a bonded SOI substrate by means of the cleave process using hydrogen ion implantation or the epitaxial layer transfer process, which may typically be the PACE process.

Firstly a first article is prepared in Step S1. More specifically, hydrogen ions or rare gas ions are implanted into an Si wafer carrying an oxide insulation film formed on at least one of the surfaces to produce a (potential) separation layer at a predetermined depth. Alternatively, the surface of an Si wafer is made porous and the non-porous Si layer is subjected to an epitaxial growth. When the PACE process is used, an Si wafer carrying no oxide film or an Si wafer having its surface oxidized will be prepared.

Meanwhile, a second article is prepared in Step S2. The second article may be an Si wafer obtained by oxidizing the surface of an ordinary Si wafer, an Si wafer having its natural oxide film removed, a quartz wafer or a metal substrate.

Subsequently in Step S3, the first and second articles prepared in Steps S1 and S2 respectively are bonded together directly or indirectly with an adhesive layer interposed therebetween. It will be sufficient when either of the surfaces of the first and second articles to be bonded together carries an insulator unless an article having a structure other than the SOI structure is prepared.

Before the bonding, the surfaces to be bonded may be activated by irradiating them with ions of hydrogen, oxygen, nitrogen or rare gas.

Then, in Step S4, (unnecessary) part of the first article that has been bonded to the second article (to produce an assembly) is removed. Roughly speaking, two different techniques are available for removing part of the first article.

One is the technique of removing part of the first article by grinding or etching and the other is the technique of separating the front side portion and the rear side portion of the first article along the separation layer formed in the first article. When the latter technique is used, the unnecessary part can be used as a first or second article once again because it maintains the profile of a wafer after the removal. The first article can be separated by heat-treating the assembly, blowing fluid that may be liquid or gas to a lateral side of the assembly or mechanically peeling it off from the rest.

The surface of the silicon layer (SOI layer) of the assembly (SOI substrate) that is now free from the unnecessary part is rather rough, showing voids, pores of the porous layer and/or undulations caused by the grinding or etching operation. Therefore, in Step S5, an upper portion of the silicon layer showing a rough surface is etched out. Then, the surface roughness of the etched silicon layer is smoothed to a level of surface roughness of less than 0.2 nm (in a 1 μm square area) due to the smoothing effect of the etching operation. If the etching is conducted under optimized conditions, the surface roughness can be reduced to less than 0.15 nm, in some cases to less than 0.1 nm.

Figure 11:
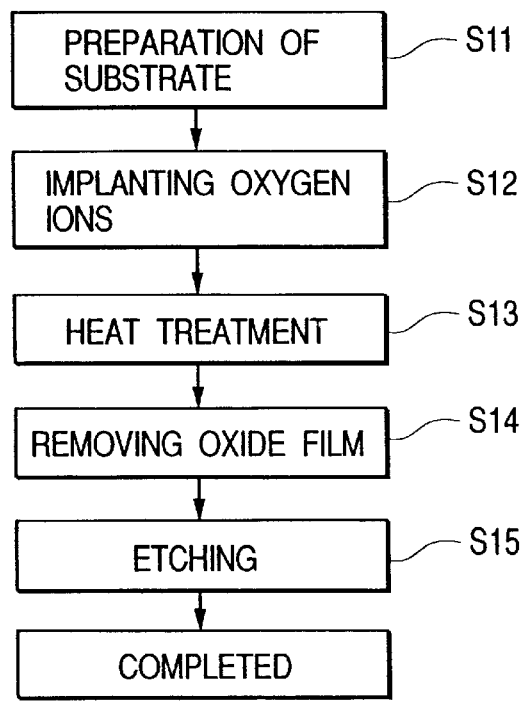
FIG. 11 is a flow chart for another mode of carrying out a method of preparing a semiconductor article by using an etching method according to the invention.

FIG. 11 is a flow chart for preparing an SOI substrate typically by means of a SIMOX process.

Firstly in Step S11, an Si wafer is prepared as starting material.

Then, in Step S12, oxygen ions are implanted typically with a dosing rate of about $2 \times 10^{17} \text{cm}^{-2}$ to $4 \times 10^{18} \text{cm}^{-2}$, using an acceleration voltage of between 100 keV and 300 keV.

Subsequently, in Step S13, the wafer implanted with oxygen ions is heat-treated at temperature between 1,000° C. and 1,400° C. to produce a buried oxide film.

Then, in Step S14, the surface oxide film is removed from the surface of the SOI layer, if such an oxide film has been formed.

The surface of the SOI layer of the obtained SOI substrate shows undulations caused by the oxygen ion implantation (Step S12) and the formation of the buried oxide film (Step S13) if a polished wafer is used as starting material. Thus, in Step S15, the wafer is subjected to an etching operation in a manner as described above to remove an upper portion of the SOI layer having undulations. After the etching, the surface of the SOI layer shows a surface roughness of less than 0.4 nm (Rrms) in a 1 μm square area and less than 1.5 nm (Rrms) in a 50 μm square area.

Of the above described methods of preparing a semiconductor article according to the invention, that of preparing an SOI substrate by means of the cleave process using hydrogen ion implantation will be discussed in greater detail by referring to FIGS. 12A through 12D.

Figure 12A:
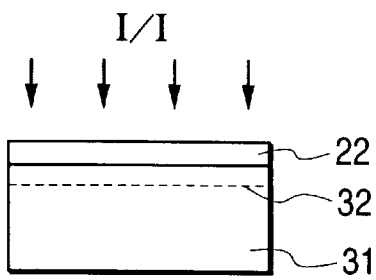
FIGS. 12A, 12B, 12C and 12D are schematic illustrations of a method of preparing a semiconductor article by using an etching method according to the invention and a cleave process by hydrogen ion implantation.

In Step S21, at least the surface of an Si wafer 31 that is the first article is thermally oxidized to produce a silicon oxide layer that becomes a buried insulation film 22 and then hydrogen or rare gas ions are implanted typically with a dosing rate of about $1 \times 10^{16} \text{cm}^{-2}$ to $1 \times 10^{19} \text{cm}^{-2}$, using an acceleration voltage of between 10 keV and 500 keV. Ions may be implanted by means of an ion implantater or, alternatively, from hydrogen or rare gas plasma, by utilizing the potential difference between the plasma and the wafer. As a result, a separation layer 32 is produced (FIG. 12A).

Figure 12B:
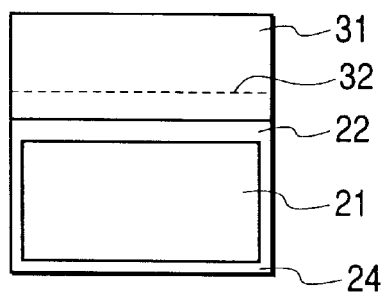

Then, in Step S22, the surface of another Si wafer 21 that is the second article is oxidized and the oxide film covering the surface to be bonded is removed to expose Si, if necessary, before the two Si wafers are bonded together with the exposed Si surface held in contact with the surface of the insulation film 22 to produce an assembly (FIG. 12B).

Subsequently, in Step S23, the assembly is separated into two parts along the separation layer 32. For separating the assembly into two parts, fluid (liquid or gas) may be applied to a lateral side of the assembly under high pressure until the separation layer that is a mechanically weak brittle layer is destroyed and the wafer 31 is peeled off (separated) from the assembly, leaving the silicon film 23 on the wafer 21. Alternatively, the two wafers may be heat-treated at temperature higher than 500° C. simultaneously with or after the bonding step to allow fine bubbles generated by hydrogen or rare gas ions to grow in the separation layer so that consequently the wafer 31 may be separated from the assembly, leaving the silicon film 23 on the wafer 21.

The wafer 31 separated from the assembly can be used as a first or second article once again because it maintains the profile of a wafer after the removal, although its height is reduced by the thickness of the silicon film 23.

Figure 12C:
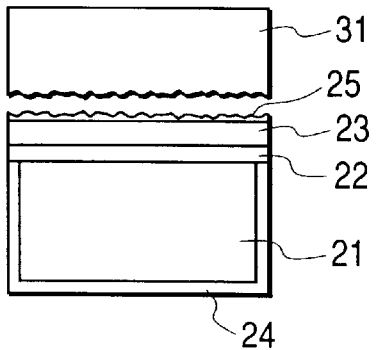

For reusing the separated wafer 31, the surface 25 exposed as a result of the separation is polished and single crystal silicon film is made to grow thereon through epitaxial growth (FIG. 12C).

Figure 12D:
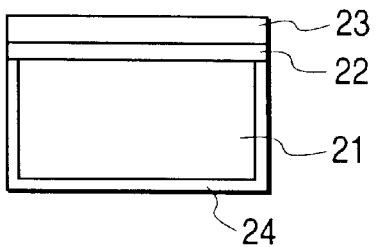

After the separation, the silicon film 23 shows a rough surface with undulations caused by fine bubbles (fine voids). Therefore, in Step S24, it is arranged vis-a-vis a silicon oxide surface and heated-treated in a hydrogen-containing reducing atmosphere to etch out an upper portion of the silicon film 23 including the rough surface by means of a method according to the invention in a manner as described above. As a result of the etching process, the silicon film 23 shows a smooth surface (FIG. 12D).

Since the wafer 21 carries a silicon oxide film 24 on the rear surface thereof in the example of FIGS. 12A through 12D, the silicon oxide film may be left on the rear surface of the SOI substrate after the end of Step S23. Therefore, a number of such SOI substrates can be simultaneously subjected to an etching process in an apparatus according to the invention as described above and illustrated in FIG. 6 or 9.

The silicon oxide film 24 on the rear surface of the wafer may be formed prior to the bonding step as described above by referring to FIGS. 12A through 12D. Alternatively, it may be formed after the separation step or during the heat treatment/bonding step, which is conducted in an oxidizing atmosphere.

Now, a method of preparing a semiconductor article by means of an epitaxial layer transfer process will be discussed in detail by referring to FIGS. 13A through 13F.

Firstly, in Step S31, an Si single crystal substrate 31 is prepared as a first article and a layer having a porous structure 33 is formed at least on the principal front surface thereof. Porous Si can be produced by anodizing the Si substrate in an HF solution. Such a porous layer shows a sponge-like structure, where pores with a diameter of about $10^{-1}$ nm to 10 nm are arranged with intervals of about $10^{-1}$ to 10 nm. While the density of single crystal Si is 2.33 g/cm$^3$, that of porous Si is variable and can be made to fall within a range between 2.1 and 0.6 g/cm$^3$ by regulating the concentration of the HF solution within a range between 50 and 20% and also regulating the current density and the rate at which alcohol is added to the reaction system. The porosity of the porous layer can be controlled by modulating the specific resistance and the conductivity type of the portion of the substrate to be made porous. An Si substrate having the p-type conductivity will show a higher porosity when it is a non-degenerate substrate (P$^-$) than when it is a degenerate substrate (P$^+$) under same anodizing conditions because the former shows a pore density higher than the latter by a digit, although it may show a small pore diameter.

Figure 13A:
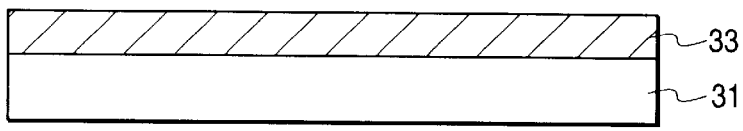
FIGS. 13A, 13B, 13C, 13D, 13E and 13F are schematic illustrations of a method of preparing a semiconductor article by using an etching method according to the invention and an epitaxial layer transfer process.

In short, the porosity of the Si substrate can be controlled by regulating these conditions and using an appropriate method selected out of a number of feasible methods. The porous layer 33 may be a single layer or a multilayer structure comprising a number of layers with different porosities. When ions are implanted in such a way that their projection range is confined within the porous layer that is produced by anodization, bubbles will be formed in the pore walls located near the projection range and consequently the porosity of the layer can be raised. The ion implantation process may be conducted before or after the step of forming the porous layer by anodization or even after the step of forming a single crystal semiconductor layer on the porous layer 33 (FIG. 13A).

Figure 13B:
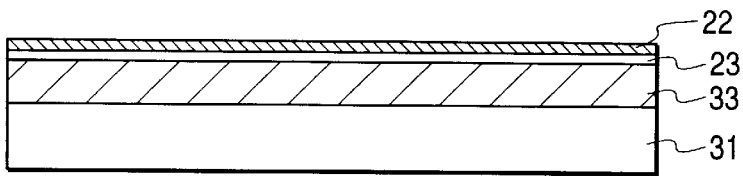

Then, in Step S32, at least a non-porous single crystal semiconductor layer 23 is formed on the porous layer. Such a non-porous single crystal semiconductor layer 23 may be a single crystal Si layer formed by epitaxial growth, a layer formed by transforming a surface layer of the porous layer 33 into a non-porous layer or some other appropriate layer. If a silicon oxide layer 22 is formed on the single crystal Si layer 23 by thermal oxidation, the interface of the single crystal silicon layer and the buried oxide film will be a suitable interface containing less surface states formed by thermal oxidation (FIG. 13B).

Figure 13C:
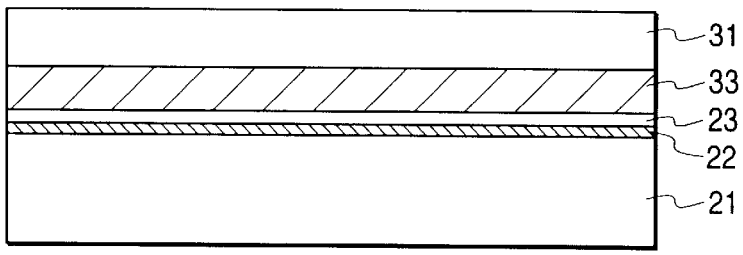

In Step S33, the principal surface (bonding surface) of the semiconductor substrate where said non-porous single crystal Si layer 23 has been formed is held in close contact with the front surface (bonding surface) of a second substrate 21. It is desirable to cleanse the surfaces in order to remove any adherent foreign objects from them before they are brought into close contact with each other (FIG. 13C). The second substrate may be an Si substrate, a substrate obtained by forming a silicon oxide film on an Si substrate, a light transmitting substrate typically made of quartz or a sapphire substrate, although it is not limited thereto so long as the surface to be bonded is sufficiently flat and smooth. While the second substrate is bonded to the first substrate with an insulation layer 22 interposed therebetween according to the illustration, the insulation layer 22 may not necessarily be used. For bonding the two substrates, an insulator thin plate may be sandwiched between the first and second substrates to produce a three-layered structure.

Subsequently, the unnecessary portion on the rear surface of the first substrate 31 and the porous layer 33 are removed to expose the non-porous single crystal Si layer 23. Either of the above described two techniques is used for this step of exposing the non-porous single crystal Si layer 23, although some other technique may alternatively be used.

With the first technique, the first substrate 31 is removed from the rear side to expose the porous layer 33 (Step S34).

Thereafter, the porous layer 33 is removed to exposed the non-porous single crystal silicon layer 23 (Step S35).

It is preferable to remove the porous layer by selective etching. Porous silicon can be selectively etched at a rate $10^5$ times greater than the rate of etching non-porous single crystal silicon when a mixture solution containing at least hydrofluoric acid and hydrogen peroxide is used. A surface active agent may be added to the etching solution in order to prevent bubbles from adhering to the surface. Alcohol such as ethyl alcohol may preferably be used as surfactant. The selective etching process may be omitted when the porous layer is very thin.

Figure 13D:
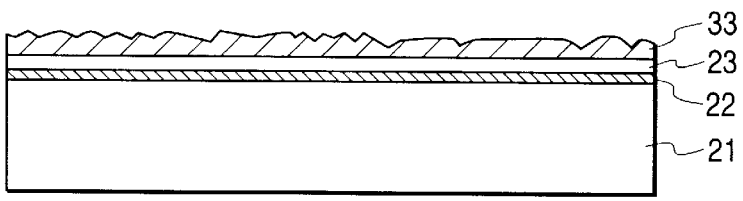

With the second technique, the substrates are separated along the porous layer 33 that operates as separation layer to produce a profile as shown in FIG. 13D for Step S34. The separation may be realized by the use of external force.

Methods that can be used for the separation include among others application of external force such as pressure, tensile force or shearing force or the use of a wedge, application of ultrasonic waves, the use of heat, the use of a technique of producing internal pressure in the porous Si by oxidizing it and expanding it from the periphery, the use of pulsating heat for producing thermal stress in or softening the porous Si and ejection of a fluid jet stream such as water jet or gas jet.

Figure 13E:
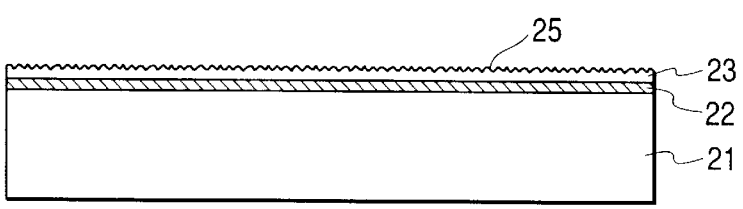

Subsequently, as shown in FIG. 13E for Step S35, the residual porous layer 33 left on the front surface of the second substrate 21 is removed by etching. The technique used above for removing the porous layer 33 by etching can also be used for etching out the residual porous layer 33. If the residual porous silicon layer 33 left on the second substrate 21 is very thin and uniform, this wet etching process using hydrofluoric acid and hydrogen peroxide may be omitted.

Figure 13F:
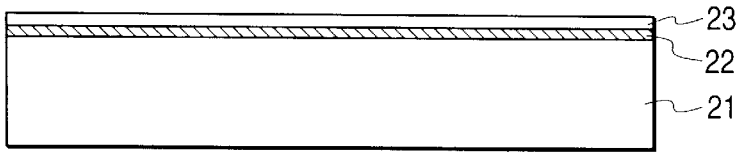

Then, in Step S36, the assembly is subjected to heat treatment in a hydrogen-containing reducing atmosphere in order to etch out the undulated upper portion 25 of the single crystal Si layer 23. At the same time, this step gives rise to the effect of reducing the boron concentration in the single crystal silicon layer and smoothing the surface of the assembly (FIG. 13F).

In a semiconductor substrate obtained by the above described method of the invention, a flat, uniform and thin single crystal Si film 23 is formed on the entire surface of the second substrate 21 with an insulation layer 22 interposed therebetween to take a large area. Such a semiconductor substrate can advantageously be used for manufacturing electronic devices that are insulated and isolated from each other.

The residual porous layer left on the surface of separation of the separated first Si single crystal substrate 31 is removed and the exposed surface is smoothed if it is unacceptably rough. Then, it will be used as a first Si single crystal substrate 31 for another time or as a second substrate 21 to be used subsequently.

No silicon oxide is formed on the rear surface of the substrate 21 in the example of FIGS. 13A through 13F. However, when a number of substrates are to be subjected simultaneously to an etching process according to the invention, using the rear surface of each SOI substrate as silicon oxide counter-surface, a silicon oxide film has to be formed on the rear surface of each substrate 21.

This requirement can easily be met by forming a silicon oxide film on the rear surface of the substrate 21 after Step S35, using the silicon film 23 as mask or before or after the bonding operation in Step S33.

FIG. 14 schematically shows the silicon surface of an article before and after an etching process according to the invention.

In FIG. 14, W3 denotes a cross section of the article before the etching process, whereas W4 denotes a cross section of the article after the etching process.

When a 1 μm square area was observed through an atomic force microscope before the etching process, the root mean square of surface roughness (Rrms) was about 0.2 nm to 20 nm.

As a result of an etching process according to the invention, the rough surface was smoothed to show an Rrms of as low as about 0.07 nm to 0.15 nm, which corresponds to the surface roughness of a polished Si wafer or a surface that is more smooth than it.

In FIG. 14, h denotes the peak to valley distance, p denotes the gap between two adjacent peaks (or the period of undulation) and t denotes the etching depth.

According to the invention, after the etching process, the surface roughness is reduced to about one third of that of the unetched surface. Thus, a highly undulated silicon surface having a peak to valley distance h as large as several nanometers to tens of several nanometers and a gap between two adjacent peaks p as large as several nanometers to hundreds of several nanometers can be smoothed to show an h value not greater than 2 nm, preferably not greater than 0.4 nm by etching.

This smoothing phenomenon may be explained as a rearrangement of the surface that occurs simultaneously with the etching process. On a rough surface, there may exist innumerable ridges showing a high surface energy surface state and planes with planar bearings of higher orders may be exposed to the surface relative to the planar bearings of the crystal layer. The surface energy of such an area is higher than the surface energy that relies on the planar bearing of the single crystal surface. In a heat treatment process conducted in a hydrogen-containing reducing atmosphere, it may be safely assumed that the energy barrier against the mobilization of surface Si atoms is lowered typically by the reducing effect of hydrogen so that Si atoms excited by thermal energy are mobilized to rearrange the surface into a flat and smooth surface that has a low surface energy. The lower the planar bearing index of the single crystal surface, the more the planarizing and smoothing effect of the present invention will be promoted.

EXAMPLE 1

Epitaxial Layer Transfer/Horizontal Furnace/SiO$_2$ Counter-surface

For each specimen, the surface of a 6-inch boron-doped Si wafer having a specific resistance of 0.015 Ω cm and a (100) orientation was anodized in a solution containing 49% HF and ethylalcohol mixed to a ratio of 2:1 to produce a 10 μm thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere to shut almost all the pores on the surface of the porous silicon. Then, a single crystal silicon film was formed on the porous silicon to an average thickness of 300 nm±5 nm by adding dichlorosilane as silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of combustion gas of oxygen and hydrogen. As a result of oxidation, the single crystal silicon film came to show a thickness of 210 nm. Meanwhile, a second silicon wafer was prepared and each of the wafers was subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. A nitrogen atmosphere was used for the heat treatment. Then, the first silicon wafer of the silicon wafer assembly was ground from the rear surface until the porous silicon became exposed. Then, the silicon wafer assembly was dipped into a mixture solution of HF and hydrogen peroxide to etch out the porous silicon. The assembly was then subjected to a wet cleansing operation and cleansed well. The single crystal silicon film produced by epitaxial growth had been transferred onto the second silicon wafer with the silicon oxide film to produce an SOI wafer.

The film thickness of the transferred single crystal silicon film was measured at intra-planar 10 mm lattice points to find that the average film thickness was 210 nm with a deviation of ±5 nm. Thus, the single crystal silicon film had to be scraped off by 10 nm to obtain a 200 nm thick SOI layer. When a 1 μm square area and a 50 μm square area of the surface were observed through an atomic force microscope at 256×256 points of measurement, the root mean square of surface roughness (Rrms) was 10.1 nm for the 1 μm square areas and 9.8 nm for the 50 μm square areas. When the boron concentration was measured by means of secondary ion mass spectrometry (SIMS), it was found that the boron concentration in the single crystal silicon film was $1.2 \times 10^{18}/cm^3$.

The rear surface of the SOI wafer was preliminarily cleansed by hydrofluoric acid to remove the natural oxide film and the other substances that might be present on the surface and then it was placed in a horizontal heat treatment furnace comprising a cylindrical furnace tube made of quartz. Gas was made to flow from an end to the other of the furnace tube. A total of four specimens were used and placed in the furnace respectively in four different modes of arrangement as will be described below. Specimen A: FIG. 15A: An SOI wafer W was horizontally placed in the furnace and a silicon wafer 3 carrying thereon a 200 nm silicon oxide film 4 was placed above and in parallel with the wafer W. The distance separating the two wafers was about 10 mm. Specimen B: FIG. 15B: An SOI wafer W was horizontally placed in the furnace and a bare silicon wafer 84 was placed above and in parallel with the wafer W. The distance separating the two wafers was about 10 mm. Specimen C: FIG. 15C: An SOI wafer W was placed in the furnace inclinedly and a silicon wafer 3 carrying thereon a 200 nm silicon oxide film 4 was placed opposite to and in parallel with the wafer W. Specimen D: FIG. 15D: An SOI wafer W was vertically placed in the furnace with the SOI surface facing the upstream and a silicon wafer 3 carrying thereon a 200 nm silicon oxide film 4 was placed opposite to the SOI surface of the wafer W in such a way that the center of each of the wafers is located on the center line of the furnace and the wafers are arranged perpendicularly relative to the center line.

All the wafers were held and supported by respective quartz jigs (not shown).

For each specimen, after replacing the atmosphere in the furnace by hydrogen, the temperature was raised to 1,100° C. and held to that level for 4 hours before the temperature was made to fall. Then, the atmosphere in the furnace was replaced by nitrogen and the wafer specimen was taken out to observe the film thickness of the single crystal silicon film for another time. The reduction in the film thickness on each of the specimens is shown below. The hydrogen gas flow rate was 5 slm. The film thickness was measured at intra-planar 10 mm lattice points and the obtained values were averaged.

|  | etched height | film thickness |
| --- | --- | --- |
| Specimen A: | 10.3 nm | 199.8 nm |
| Specimen B: | 1 nm | 208.5 mm |
| Specimen C: | 10.0 nm | 200.1 nm |
| Specimen D: | 10.4 nm | 199.1 nm |

The decrease in the film thickness of the SOI wafer was about 10 nm when silicon oxide was used for the counter-surface to obtain the specified film thickness. On the other hand, when bare silicon was used for the counter-surface facing the specimen B for the purpose of comparison, the decrease in the film thickness was as small as 1 nm, which was far from the intended etching effect.

After the above heat treatment, the specimens were observed through an atomic force microscope for surface roughness. The root mean square of surface roughness (Rrms) of each of the specimens is shown below.

|  | 1 μm square area | 50 μm square area |
| --- | --- | --- |
| Specimen A: | 0.11 nm | 0.35 nm |
| Specimen B: | 0.13 nm | 0.36 nm |
| Specimen C: | 0.11 nm | 0.33 nm |
| Specimen D: | 0.13 nm | 0.35 nm |

The above data indicate that the specimens were smoothed to the level of commercially available silicon wafers (0.13 nm, 0.31 nm).

After the above heat treatment, the boron concentration of the single crystal silicon film of each of the specimens was observed by secondary ion mass spectrometry (SIMS) to find that the boron concentration had been reduced to less than $5 \times 10^{15}/cm^3$ to prove that the specimen could feasibly be used for manufacturing electronic devices.

EXAMPLE 2

Epitaxial Layer Transfer/Vertical Furnace/Various Boats/Oxide Film rear Surface

For each specimen, the surface of a 6-inch boron-doped Si wafer having a specific resistance of 0.017 Ω cm and a (100) orientation was anodized in a solution containing 49% HF and ethylalcohol mixed to a ratio of 2:1 to produce a 10 μm thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere by adding silane gas at a very small rate to shut almost all the pores on the surface of the porous silicon. Then, a single crystal silicon film was formed on the porous silicon to an average thickness of 310 nm±5 nm by adding silane as silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of combustion gas of oxygen and hydrogen. As a result of oxidation, the single crystal silicon film came to show a thickness of 210 nm.

Meanwhile, a second silicon wafer was subjected to a thermal oxidation process to form a 200 nm thick silicon oxide film on the entire surface thereof and each of the wafers was subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. The temperature of the atmosphere of the heat treatment was raised in a mixture gas of nitrogen and oxygen and then replaced by combustion gas of oxygen and nitrogen. The temperature was held to 1,100° C. for 1 hour and then lowered in a nitrogen atmosphere. Then, the first silicon wafer of the silicon wafer assembly was ground from the rear surface until the porous silicon became exposed. Then, the silicon wafer assembly was dipped into a mixture solution of HF and hydrogen peroxide to etch out the porous silicon. The assembly was then subjected to a wet cleansing operation and cleansed well. The single crystal silicon film produced by epitaxial growth had been transferred onto the second silicon wafer with the silicon oxide film to produce an SOI wafer.

For one of the specimens, the film thickness of the transferred single crystal silicon film was measured at intraplanar 10 mm lattice points to find that the average film thickness was 210 nm with a deviation of ±4.3 nm. When a 1 $\mu$m square area and a 50 $\mu$m square area of the surface were observed through an atomic force microscope at 256×256 points of measurement, the root mean square (Rrms) of surface roughness was 10.1 nm for the 1 $\mu$m square areas and 9.8 nm for the 50 $\mu$m square areas. When the boron concentration was measured by means of secondary ion mass spectrography (SIMS), it was found that the boron concentration in the single crystal silicon film was 1.2×10$^{18}$cm$^3$.

The obtained SOI wafers were placed in a vertical heat treatment furnace comprising a furnace tube made of quartz and having a configuration as shown in FIG. 9 without removing the silicon oxide film on the rear surface. Gas was made to flow from above to below in the furnace.

The wafers 1 were arranged horizontally on a quartz boat 13 as shown in FIG. 9 in such a way that the silicon oxide rear surface of each of the SOI wafers faces the surface of the SOI layer of the SOI wafer located directly below it and the oppositely disposed surfaces are separated by a gap of 6 mm, the center of each of the wafers agreeing with the center line of the furnace tube. A silicon wafer 3 carrying thereon a silicon oxide film 4 was arranged on top of the SOI wafers, keeping the above pointed out gap to separate it from the top SOI wafer. After replacing the atmosphere in the furnace by hydrogen, the temperature in the furnace was raised to 1,100° C. and held to that level for 6 hours before the temperature was lowered to take out the wafers and observe the film thickness of the SOI of each specimen. The decrease in the film thickness of each of the SOI wafers was not greater than 10 nm±1 nm in average to realize the specified film thickness of 200 nm.

Then, the boat 13 supporting the wafers was replaced by a boat made of SiC and a similar experiment was conducted to fined that some of the wafers had been etched by 10 nm at a central area as in the case of the use of a quartz boat but by only about 1 nm in a peripheral area supported by the boat to consequently produce variations in the etching effect on the surface. Thus, it was found that a boat made of SiO$_2$ is preferably used for the purpose of the invention.

When the silicon oxide film on the rear surface of each of the wafers was removed before the heat treatment so that the SOI layer was made to face a silicon rear surface and heat-treated in a hydrogen atmosphere as in the above experiment, the decrease in the film thickness of the SOI layer facing another SOI wafer was 1 nm at most. In short, no etching effect could produced when a silicon countersurface was used.

After the heat treatment, the specimens were observed through an atomic force microscope for surface roughness. The root mean square of surface roughness (Rrms) of each of the specimens was 0.11 nm for a 1 $\mu$m square area and 0.35 nm for a 50 $\mu$m square area to indicate that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than 5×10$^{15}$/cm$^3$ to prove that the specimen could feasibly be used for manufacturing electronic devices.

EXAMPLE 3

Epitaxial Layer Transfer/Vertical Furnace/Quartz Tray

For each specimen, the surface of an 8-inch boron-doped Si wafer having a specific resistance of 0.017 Ω cm and a (100) orientation was anodized in a solution containing 49% HF and ethylalcohol mixed to a ratio of 2:1 to produce a 10 $\mu$m thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere to shut almost all the pores on the surface of the porous silicon. Then, a single crystal silicon film was formed on the porous silicon to an average thickness of 340 nm±5 nm by adding dichlorosilane as silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of combustion gas of oxygen and hydrogen. As a result of oxidation, the single crystal silicon film came to show a thickness of 250 nm. This wafer and a second wafer were separately subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. A nitrogen atmosphere was used for the heat treatment. Then, the first silicon wafer of the silicon wafer assembly was ground from the rear surface until the porous silicon became exposed. Then, the silicon wafer assembly was dipped into a mixture solution of HF and hydrogen peroxide to etch out the porous silicon. The assembly was then subjected to a wet cleansing operation and cleansed well. The single crystal silicon film produced by epitaxial growth had been transferred onto the second silicon wafer with the silicon oxide film to produce an SOI wafer.

For each of the specimens, the film thickness of the transferred single crystal silicon film was measured at intraplanar 10 mm lattice points to find that the average film thickness was 242 nm with a deviation of ±4 nm. When a 1

μm square area and a 50 μm square area of the surface were observed through an atomic force microscope at 256×256 points of measurement, the root mean square (Rrms) of surface roughness was 10.1 nm for the 1 μm square areas and 9.8 nm for the 50 μm square areas. When the boron concentration was measured by means of secondary ion mass spectrography (SIMS), it was found that the boron concentration in the single crystal silicon film was $1.2×10^{18}$ cm$^3$.

All the obtained SOI wafers whose natural oxide film on the rear surface had been removed by hydrofluoric acid were placed on respective quartz trays and put into a vertical heat treatment furnace comprising a furnace tube made of quartz. Gas was made to flow from above to below in the furnace. The wafers were arranged horizontally on a quartz boat as shown in FIG. 7 in such a way that the rear surface of each of the trays supporting an SOI wafer thereon faces the surface of the SOI layer of the SOI wafer located directly below it and the oppositely disposed surfaces are separated by a gap of 6 mm, the center of each of the wafers agreeing with the center line of the furnace tube. A commercially available silicon wafer 3 was arranged on a tray, which was then placed on top of the SOI wafers, keeping the above pointed out gap to separate it from the top SOIi wafer. After replacing the atmosphere in the furnace by hydrogen, the temperature in the furnace was raised to 1,180° C. and held to that level for 1 hour before the temperature was lowered to take out the wafers and observe the film thickness of the SOI of each specimen again. The decrease in the film thickness of each of the SOI wafers was 41.5 nm for all the SOI wafers to realize a thickness of 200.5 nm for the SOI layer.

Thus, although the wafers did not carry a silicon oxide film on the rear surface, the silicon layer was etched as a result of using a quartz tray for each specimen to provide a counter-surface for the wafer located immediately therebelow.

After the heat treatment, the specimens were observed through an atomic force microscope for surface roughness. The root mean square of surface roughness (Rrms) of each of the specimens was 0.11 nm for a 1 μm square area and 0.35 nm for a 50 μm square area to indicate that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $1×10^{15}/cm^3$ to prove that the specimen could feasibly be used for manufacturing electronic devices.

EXAMPLE 4

Separation by Means of WJ

For each specimen, the surface of an 8-inch boron-doped Si wafer having a specific resistance of 0.017 Ω cm and a (100) orientation was anodized in a solution containing 49% HF and ethylalcohol mixed to a ratio of 2:1 to produce a 10 μm thick porous silicon layer on the wafer surface. To be more accurate, the porous silicon layer included a 1 μm thick highly porous layer having a porosity of about 60% and a 5 μm thick lowly porous layer having a porosity of 20% located on the highly porous layer, which layers were produced by varying the electric current. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere by adding silane gas at a very small rate to shut almost all the pores on the surface of the porous silicon. Then, a single crystal silicon film was formed on the porous silicon to an average thickness of 340 nm±5 nm by adding dichlorosilane as silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of combustion gas of oxygen and hydrogen. As a result of oxidation, the single crystal silicon film came to show a thickness of 210 nm. Meanwhile, a second silicon wafer was subjected to a thermal oxidation process to form a 200 nm thick silicon oxide film on the entire surface thereof and each of the wafers was subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. An atmosphere of a mixture of nitrogen and oxygen was used for the heat treatment. Then, the silicon wafer assembly was separated along the highly porous layer under the fluid wedge effect by applying a high pressure water jet stream a lateral side of the assembly to expose the porous layer. Then, the second silicon wafer was dipped into a mixture solution of HF and hydrogen peroxide to etch out the porous silicon. It was then subjected to a wet cleansing operation and cleansed well. The single crystal silicon film had been transferred onto the second silicon wafer with the silicon oxide film to produce an SOI wafer.

For each of the specimens, the film thickness of the transferred single crystal silicon film was measured at intraplanar 10 mm lattice points to find that the average film thickness was 242 nm with a deviation of ±6 nm. When a 1 μm square area and a 50 μm square area of the surface were observed through an atomic force microscope at 256×256 points of measurement, the root mean square (Rrms) of surface roughness was 10.1 nm for the 1 μm square areas and 9.8 nm for the 50 μm square areas. When the boron concentration was measured by means of secondary ion mass spectrography (SIMS), it was found that the boron concentration in the single crystal silicon film was $1.2×10^{18} cm^3$.

All the obtained SOI wafers were checked for the presence of the silicon oxide film on the rear surface and put into a vertical heat treatment furnace comprising a furnace tube made of quartz. Gas was made to flow from above to below in the furnace. The wafers were arranged horizontally on a quartz boat as shown in FIG. 9 in such a way that the rear surface of each of the SOI wafers faces the surface of the SOI layer of the SOI wafer located directly below it and the oppositely disposed surfaces are separated by a gap of about 6 mm, the center of each of the wafers agreeing with the center line of the furnace tube. A commercially available silicon wafer carrying a silicon oxide on both the front and rear surfaces was arranged on top of the SOI wafers, keeping the above pointed out gap to separate it from the top SOI wafer. After replacing the atmosphere in the furnace by hydrogen, the temperature in the furnace was raised to 1,180° C. and held to that level for 1 hour before the temperature was lowered to take out the wafers and observe the film thickness of the SOI of each specimen again. The decrease in the film thickness of each of the SOI wafers was 43.2 nm.

Thus, the silicon layer was etched to obtain a desired film thickness by using a silicon oxide counter-surface.

After the heat treatment, the specimens were observed through an atomic force microscope for surface roughness. The root mean square of surface roughness (Rrms) of each of the specimens was 0.11 nm for a 1 μm square area and 0.35 nm for a 50 μm square area to indicate that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $1 \times 10^{15}/cm^3$ to prove that the specimen could feasibly be used for manufacturing electronic devices.

EXAMPLE 5

BESOI/Vertical Furnace/Quartz Boat

For each specimen, an 8-inch boron-doped Si wafer having a specific resistance of 0.007Ωcm and a (100) orientation was placed in an epitaxial growth system and heat-treated at 1,100° C. in a hydrogen atmosphere. After lowering the temperature to 900° C., a single crystal silicon film was produced to an average film thickness of 300 nm±5 nm by using hydrogen gas, to which dichlorosilane was added as silicon source gas. The silicon wafer was then taken out of the epitaxial growth system and placed in an oxidizing furnace. Thus, the surface of the single crystal silicon film was oxidized to produce a 200 nm thick silicon oxide film by means of combustion gas of oxygen and hydrogen. As a result of oxidation, the single crystal silicon film came to show a thickness of 200 nm. Meanwhile, a second silicon wafer was subjected to a thermal oxidation process to form a 200 nm thick silicon oxide film on the entire surface thereof and each of the wafers was subjected to a wet cleansing operation that is popularly used in a silicon device process to produce a clean surface. After activating the surfaces of the wafers by means of an oxygen plasma process, the two silicon wafers were washed with water and bonded together. The silicon wafer assembly obtained by bonding the two wafers was placed in a heat treatment furnace, where it was heat-treated at 400° C. for 10 hours to enhance the bonding strength at the interface. A nitrogen atmosphere was used for the heat treatment. Then, the silicon wafer assembly was scraped from the rear surface of the first silicon wafer until thickness of the first silicon wafer was reduced to about 5 μm. Subsequently, the $P^+$ layer was selectively etched by dipping the silicon wafer assembly in a 1:3:8 mixture solution of hydrofluoric acid, nitric acid and acetic acid. The single crystal silicon film had been transferred onto the second silicon wafer with the silicon oxide film to produce an SOI wafer.

For each of the specimens, the film thickness of the transferred single crystal silicon film was measured at intraplanar 10 mm lattice points to find that the average film thickness was 190 nm with a deviation of ±20 nm. When a 1 μm square area and a 50 μm square area of the surface were observed through an atomic force microscope at 256×256 points of measurement, the root mean square (Rrms) of surface roughness was 2 nm for the 1 μm square areas and 2.2 nm for the 50 μm square areas.

All the obtained SOI wafers were checked for the presence of the silicon oxide film on the rear surface and put into a vertical heat treatment furnace comprising a furnace tube made of quartz. Gas was made to flow from above to below in the furnace. The wafers were arranged horizontally on a quartz boat as shown in FIG. 9 in such a way that the rear surface of each of the SOI wafers faces the surface of the SOI layer of the SOI wafer located directly below it and the oppositely disposed surfaces are separated by a gap of about 6 mm, the center of each of the wafers agreeing with the center line of the furnace tube. A silicon wafer carrying a silicon oxide on both the front and rear surfaces was arranged on top of the SOI wafers, keeping the above pointed out gap to separate it from the top SOI wafer. After replacing the atmosphere in the furnace by hydrogen, the temperature in the furnace was raised to 1,180° C. and held to that level for 1 hour before the temperature was lowered to take out the wafers and observe the film thickness of the SOI of each specimen again. The decrease in the film thickness of each of the SOI wafers was 40.8 nm in average to make the SOI layer 149.2 nm thick, which was very close to the design value of 150 nm.

After the heat treatment, the specimens were observed through an atomic force microscope for surface roughness. The root mean square of surface roughness (Rrms) of each of the specimens was 0.11 nm for a 1 μm square area and 0.35 nm for a 50 μm square area to indicate that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $5 \times 10^{15}/cm^3$ to prove that the specimen could feasibly be used for manufacturing electronic devices.

EXAMPLE 6

Cleave Process by Hydrogen Ion Implantation/ Vertical Furnace/Quartz Boat

For each specimen, the surface of an 8-inch boron-doped Si wafer having a specific resistance of 10 Ω cm and a (100) orientation was oxidized by 300 nm and hydrogen ions were implanted into the wafer under the conditions of 50 KeV and $4 \times 10^{16}/cm^2$. The silicon wafer and a second silicon wafer on which a silicon oxide film had been formed were separately subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 400° C. for 10 hours in a heat treatment furnace to enhance the bonding strength at the interface. A nitrogen atmosphere was used for the heat treatment. During the heat treatment, the silicon wafer assembly was separated along the depth corresponding to the projection range of implanted ions. The single crystal silicon film had been transferred onto the second silicon wafer with the silicon oxide film to produce an SOI wafer.

For each of the specimens, the film thickness of the transferred single crystal silicon film was measured at intraplanar 10 mm lattice points to find that the average film thickness was 280 nm with a deviation of ±10 nm. When a 1 μm square area and a 50 μm square area of the surface were observed through an atomic force microscope at 256×256 points of measurement, the root mean square (Rrms) of surface roughness was 9.4 nm for the 1 μm square areas and 8.5 nm for the 50 μm square areas.

All the obtained SOI wafers were put into a vertical heat treatment furnace comprising a furnace tube made of quartz with the silicon oxide film carried on the rear surface of each specimen. Gas was made to flow from above to below in the furnace as shown in FIG. 9. The wafers were arranged horizontally on a quartz boat as shown in FIG. 9 in such a way that the rear surface of each of the SOI wafers faces the surface of the SOI layer of the SOI wafer located directly below it and the oppositely disposed surfaces are separated by a gap of about 6 mm, the center of each of the wafers agreeing with the center line of the furnace tube. A commercially available silicon wafer carrying a silicon oxide on the surface was arranged on top of the SOI wafers, keeping the above pointed out gap to separate it from the top SOI wafer. After replacing the atmosphere in the furnace by hydrogen, the temperature in the furnace was raised to 1,180° C. and held to that level for 2 hours before the temperature was lowered to take out the wafers and observe the film thickness of the SOI of each specimen again. The decrease in the film thickness of each of the SOI wafers was 80.3 nm in average to make the SOI layer 199.6 nm thick.

After the heat treatment, the specimens were observed through an atomic force microscope for surface roughness. The root mean square of surface roughness (Rrms) of each of the specimens was 0.11 nm for a 1 $\mu$m square area and 0.35 nm for a 50 $\mu$m square area to indicate that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $5\times10^{15}/cm^3$ to prove that the specimen could feasibly be used for manufacturing electronic devices.

When the specimens were observed before and after the heat treatment in the hydrogen atmosphere by means of radial TEM, the dislocations observed near the surface of the SOI layer before the heat treatment were not found after the heat treatment. It may be safe to assume that the dislocations were removed with the portion of the SOI layer that was removed by the etching process.

EXAMPLE 7

SIMOX/Vertical Furnace/Quartz Boat

For each specimen, oxygen ions were implanted into the polished surface of an 8-inch boron-doped Si wafer having a specific resistance of 10 $\Omega$ cm and a (100) orientation under the conditions of 550° C., 180 KeV and $4\times10^{17}/cm^2$. The silicon wafer was placed in a heat treatment furnace and heat-treated in a mixture gas of $Ar+O_2$ at 1,350° C. for 20 hours to produce a buried oxide film.

For each of the specimens, the film thickness of the single crystal silicon film formed on the buried oxide film was measured at intra-planar 10 mm lattice points to find that the average film thickness was 200 nm with a deviation of ±10 nm. When a 1 $\mu$m square area and a 50 $\mu$m square area of the surface were observed through an atomic force microscope at 256×256 points of measurement, the root mean square (Rrms) of surface roughness was 0.5 nm for the 1 $\mu$m square areas and 2 nm for the 50$\mu$m square areas to prove that the surface roughness was increased by the oxygen ion implantation. When the boron concentration was measured by means of secondary ion mass spectrography (SIMS), it was found that the boron concentration in the single crystal silicon film was $5\times10^{17}cm^3$ for all the specimens.

All the obtained SOI wafers were put into a vertical heat treatment furnace comprising a furnace tube made of quartz with the silicon oxide film carried on the rear surface of each specimen. Gas was made to flow from above to below in the furnace. As shown in FIG. 9, the wafers were arranged horizontally on a quartz boat as shown in FIG. 9 in such a way that the rear surface of each of the SOI wafers faces the surface of the SOI layer of the SOI wafer located directly below it and the oppositely disposed surfaces are separated by a gap of about 6 mm, the center of each of the wafers agreeing with the center line of the furnace tube. A silicon wafer carrying a silicon oxide on both the front and rear surfaces was arranged on top of the SOI wafers, keeping the above pointed out gap to separate it from the top SOI wafer. After replacing the atmosphere in the furnace by hydrogen, the temperature in the furnace was raised to 1,180° C. and held to that level for 1.2 hours before the temperature was lowered to take out the wafers and observe the film thickness of the SOI of each specimen again. The decrease in the film thickness of all the SOI wafers was 50 nm to make the SOI layer 150 nm±10 nm thick.

After the heat treatment, the specimens were observed through an atomic force microscope for surface roughness. The root mean square of surface roughness (Rrms) of each of the specimens was 0.3 nm for a 1 $\mu$m square area and 1.5 nm for a 50 $\mu$m square area to indicate that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $5\times10^{15}/cm^3$ to prove that the specimen could feasibly be used for manufacturing electronic devices.

EXAMPLE 8

Epitaxial Layer Transfer/Vertical Furnace/Quartz Tray

For each specimen, the surface of an 8-inch boron-doped Si wafer having a specific resistance of 0.017 $\Omega$ cm and a (100) orientation was anodized in a solution containing 49% HF and ethylalcohol mixed to a ratio of 2:1 to produce a 10 $\mu$m thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere by adding silane gas at a very small rate to shut almost all the pores on the surface of the porous silicon. Then, a single crystal silicon film was formed on the porous silicon to an average thickness of 320 nm±5 nm by adding dichlorosilane as silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of combustion gas of oxygen and hydrogen. As a result of oxidation, the single crystal silicon film came to show a thickness of 220 nm. Meanwhile, a second silicon wafer was subjected to a thermal oxidation process to form a 200 nm thick silicon oxide film on the entire surface thereof and each of the wafers was subjected to a wet cleansing operation that is popularly used in a silicon device process to produce a clean surface. After activating the surfaces by nitrogen plasma, the two silicon wafers were washed with water, dried and bonded together. The silicon wafer assembly obtained by bonding the two wafers was placed in a heat treatment furnace, where it was heat-treated at 400° C. for 10 hours to enhance the bonding strength at the interface. Then, the silicon wafer assembly was scraped from the rear surface of the first silicon wafer to expose the porous silicon. Then, the silicon wafer assembly was dipped into a mixture solution of HF and hydrogen peroxide to etch out the porous silicon. It was then subjected to a wet cleansing operation and cleansed well. The single crystal silicon film had been transferred onto the second silicon wafer with the silicon oxide film to produce an SOI wafer.

For each of the specimens, the film thickness of the transferred single crystal silicon film was measured at intra-planar 10 mm lattice points to find that the average film thickness was 220 nm with a deviation of ±7 nm. When a 1 $\mu$m square area and a 50 $\mu$m square area of the surface were observed through an atomic force microscope at 256×256 points of measurement, the root mean square (Rrms) of surface roughness was 10.1 nm for the 1 $\mu$m square areas and 9.8 nm for the 50 $\mu$m square areas. When the boron concentration was measured by means of secondary ion mass spectrography (SIMS), it was found that the boron concentration in the single crystal silicon film was 1.2×$10^{18}$cm$^3$.

All the obtained SOI wafers were placed on respective quartz trays and put into a vertical heat treatment furnace comprising a furnace tube made of quartz. Gas was made to flow from above to below in the furnace. The wafers were arranged horizontally on a quartz boat 93 as shown in FIG. 9 in such a way that the rear surface of each of trays supporting an SOI wafer thereon faces the surface of the SOI layer of the SOI wafer located directly below it and the oppositely disposed surfaces are separated by a gap of about 6 mm, the center of each of the wafers agreeing with the center line of the furnace tube. A silicon wafer was arranged on a tray, which was then placed on top of the SOI wafers, keeping the above pointed out gap to separate it from the top SOI wafer. After replacing the atmosphere in the furnace by hydrogen, the temperature in the furnace was raised to 1,000° C. and held to that level for 15 hours before the temperature was lowered to take out the wafers and observe the film thickness of the SOI of each specimen again. The decrease in the film thickness of each of the SOI wafers was 10 nm.

After the heat treatment, the specimens were observed through an atomic force microscope for surface roughness. The root mean square of surface roughness (Rrms) of each of the specimens was 0.11 nm for a 1 $\mu$m square area and 0.50 nm for a 50 $\mu$m square area to indicate that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than 1×$10^{15}$/cm$^3$ to prove that the specimen could feasibly be used for manufacturing electronic devices.

EXAMPLE 9

Epitaxial Layer Transfer/Horizontal Furnace/SiO$_2$ Counter-surface

For each specimen, the surface of a 6-inch boron-doped Si wafer having a specific resistance of 0.015Ωcm and a (100) orientation was anodized in a solution containing 49% HF and ethylalcohol mixed to a ratio of 2:1 to produce a 10 $\mu$m thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere to shut almost all the pores on the surface of the porous silicon. Then, a single crystal silicon film was formed on the porous silicon to an average thickness of 300 nm±5 nm by adding dichlorosilane as silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of combustion gas of oxygen and hydrogen. As a result of oxidation, the single crystal silicon film came to show a thickness of 210 nm. Then, this silicon wafer and a second silicon wafer was separately subjected to a wet cleansing operation that is popularly used in a silicon device process to produce a clean surface. The two silicon wafers were then bonded together. The silicon wafer assembly obtained by bonding the two wafers was placed in a heat treatment furnace, where it was heat-treated at 1,100° C. for 1 hour to enhance the bonding strength at the interface. Nitrogen was used for the atmosphere of the heat treatment. Then, the silicon wafer assembly was scraped from the rear surface of the first silicon wafer to expose the porous silicon. Then, the silicon wafer assembly was dipped into a mixture solution of HF and hydrogen peroxide to etch out the porous silicon. It was then subjected to a wet cleansing operation and cleansed well. The single crystal silicon film had been transferred onto the second silicon wafer with the silicon oxide film to produce an SOI wafer.

For each of the specimens, the film thickness of the transferred single crystal silicon film was measured at intra-planar 10 mm lattice points to find that the average film thickness was 210 nm with a deviation of ±5 nm. Since the designed film thickness was 150 nm, the single crystal silicon film had to be removed by 60 nm. When a 1 $\mu$m square area and a 50 $\mu$m square area of the surface were observed through an atomic force microscope at 256×256 points of measurement, the root mean square (Rrms) of surface roughness was 10.1 nm for the 1 $\mu$m square areas and 9.8 nm for the 50 $\mu$m square areas. When the boron concentration was measured by means of secondary ion mass spectrography (SIMS), it was found that the boron concentration in the single crystal silicon film was 1.2×$10^{18}$cm$^3$.

Each of the SOI wafers was placed in a horizontal heat treatment furnace comprising a cylindrical furnace tube made of quartz. Gas was made to flow from an end to the other of the furnace tube. The SOI wafers were placed in the furnace respectively in two different modes of arrangement as will be described below.

Specimen E: An SOI wafer was placed in the furnace with the single crystal silicon film facing the upstream of the gas flow in the furnace and a silicon wafer carrying on the front surface thereof a 133.3 nm silicon oxide film was placed vis-a-vis the SOI wafer in such a way that the center of each of the wafers was aligned with the center line of the furnace and the wafers are arranged perpendicularly relative to the center line.

Specimen F: An SOI wafer was placed in the furnace with the single crystal silicon film facing the upstream of the gas flow in the furnace and a silicon wafer carrying on the front surface thereof a 200 nm silicon oxide film was placed vis-a-vis the SOI wafer in such a way that the center of each of the wafers was aligned with the center line of the furnace and the wafers are arranged perpendicularly relative to the center line.

All the wafers were held and supported by respective quartz jigs.

For each specimen, after replacing the atmosphere in the furnace by hydrogen, the temperature was raised to 1,180° C. and held to that level for 2 hours before the temperature was made to fall. Then, the atmosphere in the furnace was replaced by nitrogen and the wafer specimen was taken out to observe the film thickness of the single crystal silicon film for another time. The reduction in the film thickness on each of the specimens is shown below. The hydrogen gas flow rate was 5 slm. The film thickness was measured at intraplana 10 mm lattice points and the obtained values were averaged.

|  | etched height | film thickness |
|---|---|---|
| Specimen E: | 60.1 nm | 150.3 nm |
| Specimen F: | 80.1 nm | 130.1 mm |

After the above heat treatment, the film thickness of the silicon oxide located vis-a-vis the SOI film was measured to find that all the silicon oxide of Specimen E had been lost. On the other hand, the silicon oxide of Specimen E was found remaining only by 23 nm. In short, the SOI layer of Specimen E were etched until all the silicon oxide film are gone and the operation of etching the SOI layer did not proceed since. Thus, the volume of silicon to be etched could be controlled by controlling the thickness of the silicon oxide layer.

A film of a semiconductor material other than Si can be formed on the surface of an article obtained by a method according to the invention by means of hetero-epitaxy.

What is claimed is:

1. A method for etching a semiconductor article having a surface comprising silicon, said method comprising a step of heat-treating said silicon surface in a hydrogen-containing reducing atmosphere, while keeping said silicon surface in a state disposed opposite to a surface comprising silicon oxide with a predetermined distance separating them such that said silicon surface and said surface comprising silicon oxide interact with each other to thereby etch said silicon surface.

2. The method for etching a semiconductor article according to claim 1, wherein said semiconductor article is an SOI substrate having a single crystal silicon film.

3. The method for etching a semiconductor article according to claim 1 or 2, wherein said silicon surface has a root mean square of surface roughness of not smaller than 0.2 nm in a 1 μm square area.

4. The method for etching a semiconductor article according to claim 1 or 2, wherein said silicon surface is an unpolished surface.

5. The method for etching a semiconductor article according to claim 1 or 2, wherein said silicon surface has a surface roughness attributable to a porous silicon layer.

6. The method for etching a semiconductor article according to claim 1 or 2, wherein said silicon surface has a surface roughness attributable to microcavities.

7. The method for etching a semiconductor article according to claim 2, wherein said SOI substrate having a single crystal silicon film is obtained by bonding a first silicon article containing said single crystal silicon film and a separation layer for predefining a separating position to a second article and then separating the bonded assembly at the separation layer predefining the separating position so as to transfer said single crystal silicon film onto said second article.

8. The method for etching a semiconductor article according to claim 7, wherein said separation layer is a layer implanted with inert gas or hydrogen ions.

9. The method for etching a semiconductor article according to claim 7, wherein said separation layer is a porous layer.

10. The method for etching a semiconductor article according to claim 2, wherein said SOI substrate has a buried oxide layer obtained by implanting oxygen ions into and heat-treating a silicon wafer.

11. The method for etching a semiconductor article according to claim 1, wherein a flow rate of gas running near and in parallel with said silicon surface is made lower than a flow rate of gas running perpendicularly relative to and outside a surface of a peripheral area of the semiconductor article while etching said silicon surface.

12. The method for etching a semiconductor article according to claim 11, wherein the flow rate of gas running near and in parallel with said silicon surface is made practically equal to 0.

13. The method for etching a semiconductor article according to claim 1, wherein a silicon wafer having a silicon oxide film on its surface is arranged opposite to the silicon surface of said semiconductor article and said semiconductor article is heat-treated until the silicon oxide film is etched to expose the underlying silicon wafer.

14. The method for etching a semiconductor article according to claim 1, wherein a tray made of silicon oxide is arranged opposite to the silicon surface of said semiconductor article.

15. The method for etching a semiconductor article according to claim 1, wherein said hydrogen-containing reducing atmosphere contains 100% hydrogen or hydrogen and an inert gas.

16. The method for etching a semiconductor article according to claim 1, wherein said hydrogen-containing reducing atmosphere shows a dew point not higher than −92° C.

17. The method for etching a semiconductor article according to claim 1, wherein said semiconductor article is supported by a member containing silicon oxide at least on its surface as principal ingredient.

18. The method for etching a semiconductor article according to claim 1, wherein said semiconductor article is arranged so as to make said silicon surface disposed perpendicularly relative to a principal flow of hydrogen-containing gas in a container.

19. The method for etching a semiconductor article according to claim 1, wherein a plurality of semiconductor articles, each having said silicon surface, are arranged coaxially in parallel with each other at predetermined regular intervals and heat-treated in a container, while causing a hydrogen-containing gas to flow around the semiconductor articles so as to make a flow rate of gas running near and in parallel with said surface practically equal to 0.

20. The method for etching a semiconductor article according to claim 1, wherein a quartz plate is arranged opposite to said silicon surface with a hydrogen-containing gas interposed therebetween for heat-treating said semiconductor article.

21. The method for etching a semiconductor article according to claim 1, wherein said surface comprising silicon oxide is a rear surface of another semiconductor article, said rear surface of another semiconductor article being arranged opposite to said silicon surface.

22. The method for etching a semiconductor article according to claim 1, wherein said article is arranged in a container having an inner wall surface comprising silicon oxide.

23. The method for etching a semiconductor article according to claim 1, wherein a plurality of semiconductor articles are supported by a support member having a surface comprising silicon oxide so as to be arranged in parallel with each other in a container having an inner wall surface also comprising silicon oxide.

24. The method for etching a semiconductor article according to claim 1, wherein about 10 nm to 200 nm of said silicon surface is removed by etching.

25. The method for etching a semiconductor article according to claim 1, wherein a rate of etching said silicon surface is between $1.0 \times 10^{-3}$ nm/min and 1.0 nm/min.

26. The method for etching a semiconductor article according to any of claims 1, 23, 24 or 25, wherein a root mean square of surface roughness of said silicon surface is made to be not greater than 0.4 nm in a 1 $\mu$m square area.

27. The method for etching a semiconductor article according to any of claims 1, 23, 24 or 25, wherein said surface comprising silicon oxide has a thickness not smaller than 2.2 times a height to be etched from said silicon surface.

28. The method for etching a semiconductor article according to any of claims 1, 19 or 23, wherein a plurality of semiconductor articles, each having said silicon surface, are arranged coaxially in parallel with each other at predetermined regular intervals to face a same direction and a dummy substrate or a quartz wafer substrate having a silicon oxide film on the surface is arranged foremost to face the silicon surface of the leading semiconductor article.

29. The method for etching a semiconductor article according to claim 2, wherein said single crystal silicon film is an SOI layer formed by epitaxial growth.

30. The method for etching a semiconductor article according to claim 2, wherein said single crystal silicon film has a film thickness between 50 nm and 500 nm before etching.

31. The method for etching a semiconductor article according to claim 1, wherein a counter-surface constituting member comprising a silicon oxide film formed on the surface of a supporting material is arranged opposite to said article so as to allow said heat treatment to continue for a period of time sufficient to etch the silicon oxide film to expose the surface of the supporting material.

32. The method for etching a semiconductor article according to claim 2, wherein the single crystal silicon film has a film thickness between 20 nm and 250 nm after etching.

33. The method for etching a semiconductor article according to claim 2, wherein the single crystal silicon film has a film thickness in a range between 50 nm and 500 nm and is etched to a film thickness between 20 nm and 250 nm.

34. A method of preparing a semiconductor article having a silicon film, said method comprising the steps of:

bonding a first article containing therein a silicon film and a separation layer defining a separating position to a second article;

separating the bonded first and second articles along the layer defining said separating position to transfer said silicon film onto said second article; and etching the surface of said silicon film transferred onto said second article by heat-treating said second article in a hydrogen-containing reducing atmosphere, while arranging a surface of silicon oxide opposite to said silicon film such that said surface of silicon oxide and said silicon film interact with each other to thereby etch the surface of said silicon film.

35. A method of preparing a semiconductor article having a silicon film, said method comprising the steps of:

bonding a first article comprising silicon and a second article;

removing part of said first article from said bonded first and second articles so as to leave a silicon film on said second article; and etching the surface of said silicon film left on said second article by heat-treating said second article in a hydrogen-containing reducing atmosphere, while arranging a surface of silicon oxide opposite to said silicon film such that said surface of silicon oxide and said silicon film interact with each other to thereby etch the surface of said silicon film.

36. The method of preparing a semiconductor article having a silicon film according to claim 34 or 35, further comprising a step of forming a silicon oxide film on a rear surface of said second article to provide a surface of silicon oxide to be in a position opposite to a silicon film of another article to be processed.

37. The method of preparing a semiconductor article having a silicon film according to claim 35, further comprising a step of preparing the first article by forming a non-porous single crystal silicon film on a porous silicon layer.

38. The method of preparing a semiconductor article having a silicon film according to claim 34, wherein said separation layer is a porous layer and said etching step is conducted after selectively etching a residual porous layer remaining on said silicon film after the separation.

39. The method of preparing a semiconductor article having a silicon film according to claim 34, wherein said separation layer is a porous layer and said etching step is conducted with a residual porous layer remaining on said silicon film after the separation.

40. The method of preparing a semiconductor article having a silicon film according to claim 34, wherein said separation layer is a layer implanted with inert gas or hydrogen ions and said etching step is conducted without polishing the surface of said silicon film exposed after the separation.

41. The method of preparing a semiconductor article having a silicon film according to claim 35, wherein said first article comprises a porous layer and said removing step includes a step of removing the porous layer remaining on said silicon film.

42. The method of preparing a semiconductor article having a silicon film according to claim 35, wherein a porous layer remains on said silicon film after the removing step.

43. The method of preparing a semiconductor article having a silicon film according to claim 35, wherein the surface of said silicon film is a surface subjected to plasma etching after said removing step.

44. The method of preparing a semiconductor article having a silicon film according to claim 34 or 35, wherein said silicon film surface has a root mean square of surface roughness of not smaller than 0.2 nm in a 1 $\mu$m square area.

45. The method of preparing a semiconductor article having a silicon film according to claim 34 or 35, wherein said silicon film surface has a surface roughness attributable to a porous silicon layer.

46. The method of preparing a semiconductor article having a silicon film according to claim 34 or 35, wherein said silicon film surface has a surface roughness attributable to microcavities.

47. The method of preparing a semiconductor article having a silicon film according to claim 34, wherein said separation layer is a layer implanted with inert gas or hydrogen ions.

48. The method of preparing a semiconductor article having a silicon film according to claim 34, wherein said separation layer is a porous layer.

49. The method of preparing a semiconductor article having a silicon film according to claim 34 or 35, wherein a flow rate of gas running near and in parallel with said silicon film surface is made lower than a flow rate of gas running perpendicularly relative to and outside a surface of a peripheral area of the semiconductor article in said etching step.

50. The method of preparing a semiconductor article having a silicon film according to claim 49, wherein the flow rate of gas running near and in parallel with said silicon film surface is made practically equal to 0.

51. The method of preparing a semiconductor article having a silicon film according to claim 34 or 35, wherein a silicon wafer having a silicon oxide film on its surface is arranged opposite to the silicon film of said semiconductor article and said semiconductor article is heat-treated until the silicon oxide film is etched to expose the underlying silicon wafer.

52. The method of preparing a semiconductor article having a silicon film according to claim 34 or 35, wherein a tray made of silicon oxide is arranged opposite to the silicon film of said semiconductor article.

53. The method of preparing a semiconductor article having a silicon film according to claim 34 or 35, wherein said hydrogen-containing reducing atmosphere contains 100% hydrogen or hydrogen and an inert gas.

54. The method of preparing a semiconductor article having a silicon film according to claim 34 or 35, wherein said hydrogen-containing reducing atmosphere shows a dew point not higher than −92° C.

55. The method of preparing a semiconductor article having a silicon film according to claim 34 or 35, wherein said semiconductor article is supported by a member containing silicon oxide at least on its surface as principal ingredient.

56. The method of preparing a semiconductor article having a silicon film according to claim 34 or 35, wherein said semiconductor article is arranged so as to make said silicon film surface disposed perpendicularly relative to a principal flow of hydrogen-containing gas in a container.

57. The method of preparing a semiconductor article having a silicon film according to claim 34 or 35, wherein a plurality of semiconductor articles, each having said silicon film surface, are arranged coaxially in parallel with each other at predetermined regular intervals and heat-treated in a container, while causing a hydrogen-containing gas to flow around the semiconductor articles so as to make a flow rate of gas running near and in parallel with said silicon film surfaces practically equal to 0.

58. The method of preparing a semiconductor article having a silicon film according to claim 34 or 35, wherein a quartz plate is arranged opposite to said silicon film surface with a hydrogen-containing gas interposed therebetween for heat-treating said semiconductor article.

59. The method of preparing a semiconductor article having a silicon film according to claim 34 or 35, wherein said silicon oxide surface is a rear surface of another semiconductor article, said rear surface of another semiconductor article being arranged opposite to said silicon film surface.

60. The method of preparing a semiconductor article having a silicon film according to claim 34 or 35, wherein said article is arranged in a container having an inner wall surface comprising silicon oxide.

61. The method of preparing a semiconductor article having a silicon film according to claim 34 or 35, wherein a plurality of semiconductor articles are supported by a support member having a surface comprising silicon oxide so as to be arranged in parallel with each other in a container having an inner wall surface also comprising silicon oxide.

62. The method of preparing a semiconductor article having a silicon film according to claim 34 or 35, wherein about 10 nm to 200 nm of said silicon film surface is removed by etching.

63. The method of preparing a semiconductor article having a silicon film according to claim 34 or 35, wherein a rate of etching said silicon film surface is between $1.0 \times 10^{-3}$ nm/min and 1.0 nm/min.

64. The method of preparing a semiconductor article having a silicon film according to claim 34 or 35, wherein a root mean square of surface roughness of said silicon film surface is made to be not greater than 0.4 nm in a 1 $\mu$m square area.

65. The method of preparing a semiconductor article having a silicon film according to claim 34 or 35, wherein said surface of silicon oxide has a thickness not smaller than 2.2 times a height to be etched from said silicon film surface.

66. The method of preparing a semiconductor article having a silicon film according to claim 34 or 35, wherein a plurality of semiconductor articles, each having said silicon film surface, are arranged coaxially in parallel with each other at predetermined regular intervals to face a same direction and a dummy substrate or a quartz wafer substrate having a silicon oxide film on the surface is arranged foremost to face the silicon film surface of the leading semiconductor article.

67. The method of preparing a semiconductor article having a silicon film according to claim 34 or 35, wherein the silicon film surface has a single crystal silicon film formed by epitaxial growth.

68. The method of preparing a semiconductor article having a silicon film according to claim 34 or 35, wherein the silicon film surface has a single crystal silicon film having a film thickness between 50 nm and 500 nm before etching.

69. The method of preparing a semiconductor article having a silicon film according to claim 34 or 35, wherein the silicon film surface has a single crystal silicon film having a film thickness between 20 mn and 250 nm after etching.

70. The method of preparing a semiconductor article having a silicon film according to claim 34 or 35, wherein the silicon film surface has a single crystal silicon film having a film thickness in a range between 50 nm and 500 nm and is etched to a film thickness between 20 nm and 250 nm.

71. The method for etching a semiconductor article according to claim 1, wherein the temperature of said heat treatment is higher than 300° C. and lower than the melting point of silicon.

72. The method for etching a semiconductor article according to claim 1, wherein the temperature of said heat treatment is higher than 800° C. and lower than the melting point of silicon.

73. The method of preparing a semiconductor article having a silicon film according to claim 34 or 35, wherein the temperature of said heat treatment is higher than 300° C. and lower than the melting point of silicon.

74. The method of preparing a semiconductor article having a silicon film according to claim 34 or 35, wherein the temperature of said heat treatment is higher than 800° C. and lower than the melting point of silicon.

75. The method for etching a semiconductor article according to claim 1, wherein a flow rate of gas flowing along an outer peripheral area of said semiconductor article in a furnace is not smaller than 10 cc/min.cm$^2$ and not greater than 300 cc/min.cm$^2$.

76. The method of preparing a semiconductor article having a silicon film according to claim 34 or 35, wherein a flow rate of gas flowing along an outer peripheral area of said silicon film surface in a furnace is not smaller than 10 cc/min.cm$^2$ and not greater than 300 cc/min.cm$^2$.

77. The method for etching a semiconductor article according to claim 1, wherein said predetermined distance is not greater than 20 mm.

78. The method for etching a semiconductor article according to claim 1, wherein said predetermined distance is not greater than 10 mm.

79. The method of preparing a semiconductor article having a silicon film according to claim 34 or 35, wherein a distance between said silicon film and said surface of silicon oxide is not greater than 20 mm.

80. The method of preparing a semiconductor article having a silicon film according to claim 34 or 35, wherein a distance between said silicon film and said surface of silicon oxide is not greater than 10 mm.

81. A method of preparing a semiconductor article having a silicon film, said method comprising the steps of:
bonding a first article containing therein a silicon film and a separation layer defining a separating position to a second article;
separating the bonded first and second articles along the layer defining said separating position to transfer said silicon film onto said second article; and
etching the surface of said silicon film transferred onto said second article by heat-treating said second article in a hydrogen-containing reducing atmosphere, while arranging a surface of silicon oxide opposite to said silicon film with a distance not greater than 20 mm.

82. The method of preparing a semiconductor article having a silicon film according to claim 34, further comprising a step of preparing the first article by forming a non-porous single crystal silicon film on a porous silicon layer which serves as the separation layer.

* * * * *